United States Patent
Lee et al.

(10) Patent No.: US 11,410,456 B2
(45) Date of Patent: Aug. 9, 2022

(54) DISPLAY DEVICE HAVING SENSING DETECTION AND METHOD OF DRIVING THE SAME

(71) Applicant: Samsung Display Co., Ltd., Yongin-si (KR)

(72) Inventors: Soongyu Lee, Daegu (KR); Kyowon Ku, Seoul (KR); Youngsik Kim, Yongin-si (KR); Junghak Kim, Hwaseong-si (KR); Jinwoo Kim, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/088,583

(22) Filed: Nov. 4, 2020

(65) Prior Publication Data

US 2021/0217358 A1    Jul. 15, 2021

(30) Foreign Application Priority Data

Jan. 15, 2020   (KR) .................. 10-2020-0005448

(51) Int. Cl.
*G06V 40/12*         (2022.01)
*G09G 3/3208*        (2016.01)
(Continued)

(52) U.S. Cl.
CPC ...... *G06V 40/1382* (2022.01); *G06V 40/1306* (2022.01); *G09G 3/3208* (2013.01); *H01L 27/323* (2013.01)

(58) Field of Classification Search
CPC .. G09G 3/3208; G09G 3/3225; H01L 27/323; G06K 9/0002; G06K 9/00087;
(Continued)

(56) References Cited

U.S. PATENT DOCUMENTS 9,049,998 B2    6/2015  Brumback et al.
2016/0078209 A1  3/2016  Kim et al.
(Continued)

FOREIGN PATENT DOCUMENTS

| KR | 10-1700217     | 1/2017  |
|----|----------------|---------|
| KR | 10-1928319     | 12/2018 |
| KR | 10-2019-0037728| 4/2019  |

OTHER PUBLICATIONS

R. Rox Anderson, B.S. et al., The Optics of Human Skin, The Journal of Investigative Dermatology, vol. 77, No. J,, 77:13-19, 198, Department of Dermatology, Harvard Medical School, Massachusetts General Hospital, Boston, Massachusetts, U.S.A.

*Primary Examiner* — Premal R Patel
(74) *Attorney, Agent, or Firm* — H.C. Park & Associates, PLC

(57) ABSTRACT

A method of driving a display device including driving a display panel including a sensing area defined above a fingerprint sensor in an initial mode, driving the sensing area in a first color pattern and a second color pattern having a color different from a color of the first color pattern, sensing a fingerprint through the fingerprint sensor that receives a light reflected by the fingerprint when the fingerprint is adjacent to the sensing area, determining whether the sensed fingerprint is a duplicate fingerprint, and performing a user authentication mode when the sensed fingerprint is a normal fingerprint. The first color pattern has a light transmittance higher than a light transmittance of the second color pattern.

17 Claims, 25 Drawing Sheets

(51) Int. Cl.
*H01L 27/32* (2006.01)
*G06V 40/13* (2022.01)

(58) Field of Classification Search
CPC ..... G06K 9/0004; G06F 21/32; G06F 3/0488;
G06V 40/1306; G06V 40/1382; G06V
40/1318; G06V 40/1365; G06V 40/1324
See application file for complete search history.

(56) References Cited

U.S. PATENT DOCUMENTS

| | | | |
|---|---|---|---|
| 2016/0246396 A1* | 8/2016 | Dickinson | G06F 3/03545 |
| 2017/0316250 A1* | 11/2017 | Roh | G06F 3/0488 |
| 2017/0364728 A1* | 12/2017 | Bachurinskii | G06K 9/0012 |
| 2018/0046281 A1 | 2/2018 | Pi et al. | |
| 2018/0081490 A1* | 3/2018 | Wang | G06F 3/04883 |
| 2019/0102595 A1 | 4/2019 | Lee et al. | |
| 2019/0102598 A1* | 4/2019 | Jiang | G06K 9/0004 |
| 2020/0097698 A1* | 3/2020 | Seo | G06F 3/04883 |
| 2020/0193138 A1* | 6/2020 | Li | G06K 9/0012 |
| 2020/0401782 A1* | 12/2020 | Cheng | G06K 9/6256 |
| 2021/0004562 A1* | 1/2021 | Chiang | G06K 9/00906 |
| 2021/0049392 A1* | 2/2021 | Juncker | G06F 21/32 |
| 2021/0097257 A1* | 4/2021 | Gupta | G06F 21/32 |
| 2021/0142036 A1* | 5/2021 | Andersen | G06K 9/00013 |

\* cited by examiner

DISPLAY DEVICE HAVING SENSING DETECTION AND METHOD OF DRIVING THE SAME

CROSS REFERENCE TO RELATED APPLICATION

This application claims priority from and the benefit of Korean Patent Application No. 10-2020-0005448, filed on Jan. 15, 2020, which is hereby incorporated by reference for all purposes as if fully set forth herein.

BACKGROUND

Field

Exemplary embodiments of the invention relate generally to a display device and a method of driving the display device.

Discussion of the Background

Electronic devices that provide an image to a user, such as a smart phone, a digital camera, a notebook computer, a navigation unit, and a smart television, include a display device to display the image. The display device includes a display panel that generates the image, an input device such as an input sensing part, and an authentication device such as a fingerprint sensing unit.

The input sensing part is disposed on the display panel and senses a user's touch. A signal sensed by the input sensing part is converted into an input signal. The display panel provides the image corresponding to the input signal from the input sensing part to a user.

The fingerprint sensing unit senses a fingerprint of a finger that makes contact with the input sensing part when the display panel is driven in an initial mode. The display device compares the fingerprint sensed by the fingerprint sensing unit with a user's fingerprint. When the sensed fingerprint matches the user's fingerprint, the display panel is driven in a main mode.

The above information disclosed in this Background section is only for understanding of the background of the inventive concepts, and, therefore, it may contain information that does not constitute prior art.

SUMMARY

The inventive concepts provide a display device having enhanced authentication security.

The inventive concepts provide a method of driving the display device.

Additional features of the inventive concepts will be set forth in the description which follows, and in part will be apparent from the description, or may be learned by practice of the inventive concepts.

Exemplary embodiments of the inventive concepts provide a method of driving a display device including driving a display panel including a sensing area defined above a fingerprint sensor in an initial mode, driving the sensing area in a first color pattern and a second color pattern having a color different from a color of the first color pattern, sensing a fingerprint through the fingerprint sensor that receives a light reflected by the fingerprint when the fingerprint is adjacent on the sensing area, determining whether the sensed fingerprint is a duplicate fingerprint, and performing a user authentication mode when the sensed fingerprint is a normal fingerprint. The first color pattern has a light transmittance higher than a light transmittance of the second color pattern.

Exemplary embodiments of the inventive concepts also provide a display device including a display panel including a sensing area and driven in an initial mode and a main mode, a fingerprint sensor disposed under the sensing area and sensing a fingerprint adjacent on the sensing area when the display panel is driven in the initial mode, and a control module controlling an operation of the display panel and the fingerprint sensor. The fingerprint sensor receives a light provided to the fingerprint and reflected by the fingerprint in the sensing area and senses the fingerprint, the control module drives the sensing area in a first color pattern and a second color pattern having a color different from a color of the first color pattern when the display panel is driven in the initial mode, and the first color pattern has a light transmittance higher than a light transmittance of the second color pattern.

Exemplary embodiments of the inventive concepts also provide a method of driving a display device including storing a touch position of a display module as a first touch position when the display module is touched to be driven in an initial mode, storing a touch position of a fingerprint as a second touch position when the fingerprint touches a portion of the display module where a fingerprint sensor is disposed and sensing the fingerprint, performing a first user authentication mode when the first touch position and the second touch position are same as each other, and performing a second user authentication mode having an enhanced security mode compared with the first user authentication mode when the first touch position and the second touch position are different from each other.

It is to be understood that both the foregoing general description and the following detailed description are exemplary and explanatory and are intended to provide further explanation of the invention as claimed.

BRIEF DESCRIPTION OF THE DRAWINGS

The above and other advantages of the inventive concepts will become readily apparent by reference to the following detailed description when considered in conjunction with the accompanying drawings wherein.

DETAILED DESCRIPTION

Figure 1:
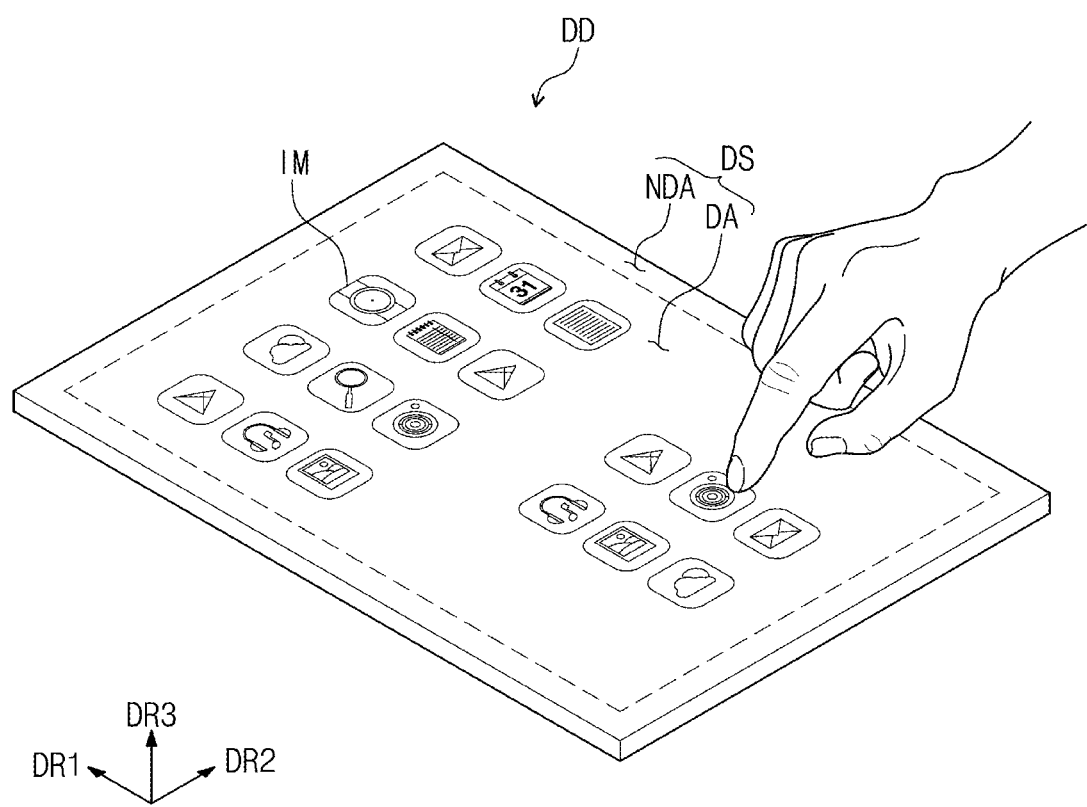
FIG. 1 is a perspective view illustrating a display device according to an exemplary embodiment of the inventive concepts.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the"

are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

According to embodiments described herein, when a fingerprint is input to the display module, whether the sensed fingerprint is a duplicate fingerprint is determined first, and then a user authentication mode is performed. Therefore, the authentication security of the display device may be enhanced.

As described herein, a position of a touch operation configured to drive a display module in an initial mode is compared with a touch position of the fingerprint sensor to sense the fingerprint, and a first user authentication mode or a second user authentication mode that is enhanced compared with the first user authentication mode may be performed according to the compared result. As a result, the authentication security of the display device may be enhanced.

Also, when the fingerprint is sensed, a motion of the display module may be sensed, and the first user authentication mode or the second user authentication mode is performed depending on whether the motion of the display module is sensed in combination with fingerprint sensing. Thus, another method of authentication security may be used to enhance authentication security of a display device.

Hereinafter, the present invention will be explained in detail with reference to the accompanying drawings.

FIG. 1 is a perspective view illustrating a display device DD according to an exemplary embodiment of the inventive concepts.

Referring to FIG. 1, the display device DD according to an exemplary embodiment of the inventive concepts may have a rectangular shape defined by long sides extending in a first direction DR1 and short sides extending in a second direction DR2 crossing the first direction DR1. However, the shape of the display device DD should not be limited to the rectangular shape, and the display device DD may have a variety of shapes, such as a circular shape or a polygonal shape.

Hereinafter, a direction substantially perpendicular to a plane defined by the first direction DR1 and the second direction DR2 may be referred to as a "third direction DR3".

An upper surface of the display device DD may be referred to as a "display surface DS" and may be a plane surface defined by the first direction DR1 and the second direction DR2. Images IM generated by the display device DD may be provided to a user through the display surface DS.

The display surface DS may include a display area DA and a non-display area NDA defined around the display area DA. The display area DA may display the image, and the non-display area NDA may not display the image. The non-display area NDA may surround the display area DA and may define an edge of the display device DD, which is printed by a predetermined color.

The display device DD may be applied to a large-sized electronic item, such as a television set, a monitor, or an outdoor billboard, and a small and medium-sized electronic item, such as a personal computer, a notebook computer, a personal digital assistant, a car navigation unit, a game unit, a smartphone, a tablet computer, and a camera. These are merely exemplary, and thus, the display device DD may be applied to other electronic devices as long as they do not depart from the concept of the inventive concepts.

Figure 2:
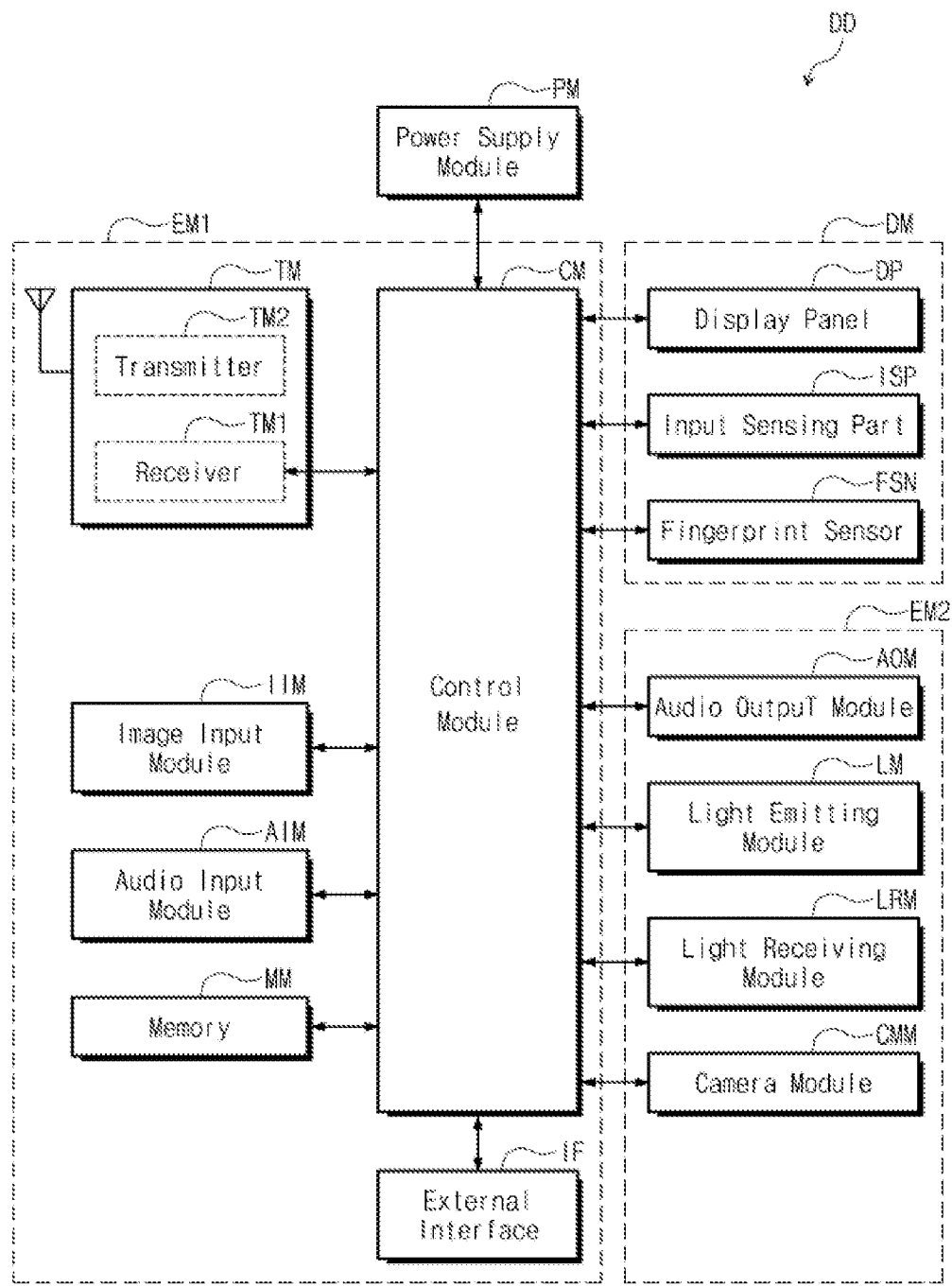
FIG. 2 is a block diagram illustrating the display device of FIG. 1.

FIG. 2 is a block diagram illustrating the display device DD of FIG. 1.

Referring to FIG. 2, the display device DD may include a display module DM, a power supply module PM, a first electronic module EM1, and a second electronic module EM2. The display module DM, the power supply module PM, the first electronic module EM1, and the second electronic module EM2 may be electrically connected to each other.

The power supply module PM may supply a power source for an overall operation of the display device DD. The power supply module PM may include a normal battery module.

The first electronic module EM1 and the second electronic module EM2 may include a variety of functional modules to drive the display device DD. The first electronic module EM1 may be mounted directly on a main board electrically connected to the display module DM or may be electrically connected to the main board via a connector (not illustrated) after being mounted on a separate substrate.

The first electronic module EM1 may include a control module CM, a wireless communication module TM, an image input module IIM, an audio input module AIM, a memory MM, and an external interface IF. Some modules among the modules may be electrically connected to a mother board through a flexible circuit board without being mounted on the main board.

The control module CM may control an overall operation of the display device DD. The control module CM may activate or deactivate the display module DM. The control module CM may control other modules, such as the image input module IIM or the audio input module AIM, based on a touch signal provided from the display module DM. The control module CM may perform a user authentication mode using fingerprint information provided from the display module DM.

The wireless communication module TM may transmit/receive a wireless signal to/from other terminals using a Bluetooth or WiFi link. The wireless communication module TM may transmit/receive a voice signal using a general communication line. The wireless communication module TM may include a transmitter TM1 that is configured to modulate a signal to be transmitted and configured to transmit the modulated signal and a receiver TM2 that demodulates a signal applied thereto.

The image input module IIM may process an image signal and may convert the image signal into image data that may be displayed through the display module DM. The audio input module AIM may receive an external sound signal through a microphone in a record mode or a voice recognition mode and may convert the external sound signal to electrical voice data.

The external interface IF may serve as an interface between the control module CM and external devices, such as an external charger, a wired/wireless data port, a card socket (e.g., a memory card and a SIM/UIM card), etc.

The second electronic module EM2 may include an audio output module AOM, a light emitting module LM, a light receiving module LRM, and a camera module CMM. The modules may be mounted directly on the main board, may be electrically connected to the display module DM through a connector (not illustrated) after being mounted on a separate substrate, or may be electrically connected to the first electronic module EM1.

The audio output module AOM may convert audio data provided from the wireless communication module TM or audio data stored in the memory MM and may output the converted audio data to the outside. The light emitting module LM may generate a light and may output the light. The light emitting module LM may emit an infrared ray. The light emitting module LM may include an LED element. The light receiving module LRM may sense the infrared ray. The light receiving module LRM may be activated when the infrared ray having a predetermined level or higher is sensed. The light receiving module LRM may include a complementary metal oxide semiconductor (CMOS) sensor.

The infrared ray generated by and output from the light emitting module LM may be reflected by an external object, e.g., a user's finger or face, and the reflected infrared ray may be incident into the light receiving module LRM. The camera module CMM may take an image of an external object.

The display module DM may include a display panel DP, an input sensing part ISP, and a fingerprint sensor FSN. The display panel DP may display the image using the image data provided from the control module CM. The control module CM may drive the display module DM in the initial mode and the main mode following the initial mode. In detail, the display panel DP may be driven in the initial mode and the main mode in response to the control by the control module CM, and thus, may display an image corresponding to the initial mode and an image corresponding to the main mode.

In the initial mode, the control module DM may perform the user authentication mode. When the user is authenticated as an owner of the display device DD in the initial mode, the control module CM may drive the display panel DP in the main mode. In the main mode, the display panel DP may display a variety of images desired by the user. A user authentication method may be performed in various ways, such as a fingerprint authentication method, a password authentication method, and a facial recognition authentication method. Hereinafter, the fingerprint authentication method will be described as the user authentication method.

The input sensing part ISP may sense an external input, e.g., a user's hand or a touch pen, and may transmit the sensed signal to the control module CM as an input signal. The control module CM may control an operation of the display panel DP in response to the input signal.

The fingerprint sensor FSN may sense a fingerprint of a finger touching the display module DM when the display panel DP is driven in the initial mode. Fingerprint information sensed by the fingerprint sensor FSN may be transmitted to the control module CM.

The control module CM may compare the sensed fingerprint information with user's fingerprint information stored therein. When the sensed fingerprint information match the user's fingerprint information, the control module CM may drive the display panel DP such that the mode of the display panel DP is switched from the initial mode to the main mode.

Figure 3:
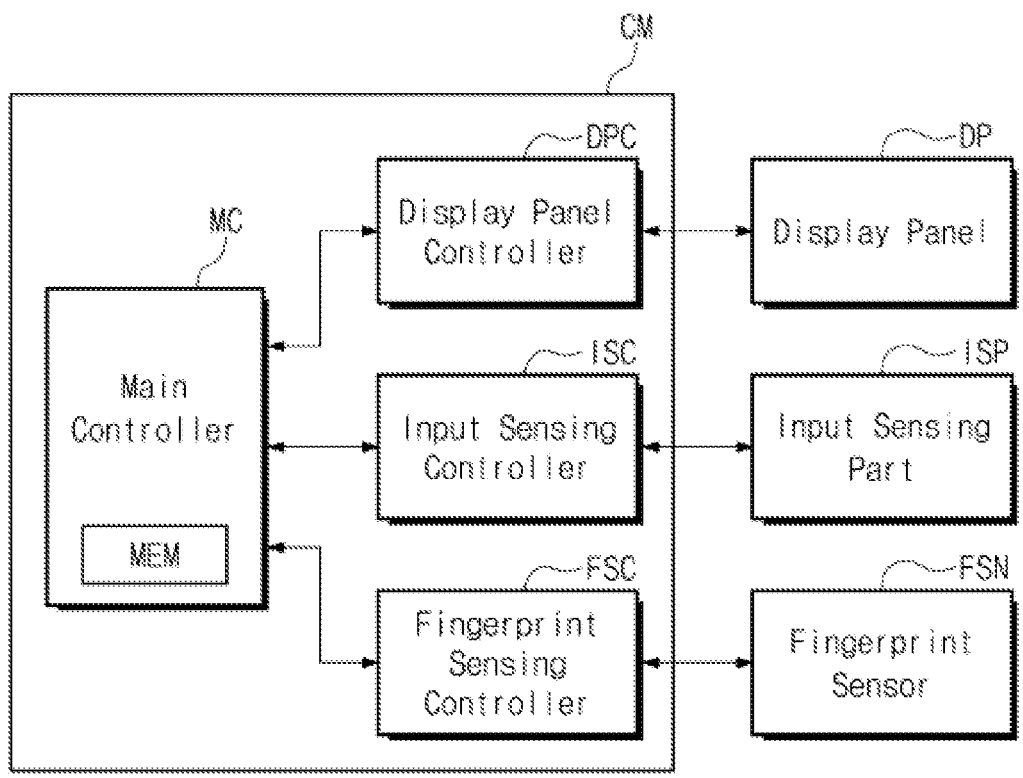
FIG. 3 is a block diagram illustrating a control module of FIG. 2.

FIG. 3 is a block diagram illustrating the control module CM of FIG. 2.

Referring to FIG. 3, the control module CM may include a main controller MC, a display panel controller DPC controlling the operation of the display panel DP, an input sensing controller ISC controlling the operation of the input sensing part ISP, and a fingerprint sensing controller FSC controlling the operation of the fingerprint sensor FSN. When the display device DD is operated, the main controller MC may control operations of the display panel controller DPC, the input sensing controller ISC, and the fingerprint sensing controller FSC.

The display panel controller DPC may drive the display panel DP in the initial mode and the main mode in response to the control by the main controller MC. The display panel controller DPC may be referred to as a "timing controller". When the display panel DP is driven in the initial mode, a light generated by the display panel DP may be provided to the fingerprint sensor FSN.

The input sensing controller ISC may drive the input sensing part ISP in response to the control by the main controller MC. The input sensing controller ISC may convert the signal sensed by the input sensing part ISP to the input signal and may provide the input signal to the main controller MC. The input signal may include touch position information of the user when the user touches the input sensing part ISP. The touch position information may be referred to as a "touch coordinate".

When the display panel DP is driven in the initial mode, the fingerprint sensing controller FSC may drive the fingerprint sensor FSN in response to the control by the main controller MC. When the fingerprint approaches the fingerprint sensor FSN, a light generated by the display panel DP may be provided to the fingerprint, and a light reflected by the fingerprint may be provided to the fingerprint sensor FSN. The fingerprint sensor FSN may sense the fingerprint based on the light reflected by the fingerprint. The fingerprint sensing controller FSC may provide the fingerprint information sensed by the fingerprint sensor FSN to the main controller MC.

The fingerprint of the user may be stored in a memory MEM of the main controller MC. The main controller MC may compare the sensed fingerprint with the stored user's fingerprint. When the sensed fingerprint matches the stored user's fingerprint, the display panel controller DPC may drive the display panel DP in the main mode in response to the control by the main controller MC.

In an exemplary embodiment of the inventive concepts, the control module CM may further enhance the user authentication mode. The control module CM may determine whether the sensed fingerprint is the duplicate fingerprint. The duplicate fingerprint may be defined as a "fake fingerprint". For example, a fingerprint of others may be copied to a tape by placing and pressing down the tape on a portion where the finger is touched.

The control module CM may compare the sensed fingerprint with the duplicate fingerprint and, when the sensed fingerprint is determined to be the duplicate fingerprint, the control module CM may request re-entry of the fingerprint without performing the user authentication mode. The control module CM may compare the sensed fingerprint with the duplicate fingerprint and, when the sensed fingerprint is determined to be a normal fingerprint, the control module CM may perform the user authentication mode to compare the sensed fingerprint with the stored user's fingerprint.

For example, the fingerprint sensing controller FSC may provide the sensed fingerprint sensed by the fingerprint sensor FSN to the main controller MC as an output signal. The output signal may be defined as an output value of the sensed fingerprint. The main controller MC may compare the output value of the sensed fingerprint sensed by the fingerprint sensor FSN with a reference value corresponding to the duplicate fingerprint. The main controller MC may determine the sensed fingerprint as the duplicate fingerprint or the normal fingerprint according to the compared result of the output value and the reference value. This operation will be described in detail later.

In an exemplary embodiment of the inventive concepts, the control module CM may be operated as follows to further enhance the user authentication mode.

The display module DM may be driven in the initial mode when a touch event occurs on the display module DM. For example, the input sensing part ISP may be touched to drive the display module DM in the initial mode, and the control module CM may drive the display panel DP in the initial mode according to the touched signal. A touch position of the display module DM may be provided to the main controller MC through the input sensing controller ISC. The main controller MC may store the touch position of the display module DM as a first touch position.

When the fingerprint touches the display module DM for the fingerprint input, the input sensing part ISP may sense the touch position of the fingerprint, and the fingerprint may be sensed by the fingerprint sensor FSN. The touch position of the fingerprint may be the touch position of the fingerprint sensor FSN. The touch position of the fingerprint may be provided to the main controller MC through the input sensing controller ISC. The main controller MC may store the touch position of the fingerprint as a second touch position.

The user authentication mode may include a first user authentication mode and a second user authentication mode, which is enhanced protection mode compared with the first user authentication mode. The main controller MC may perform the first user authentication mode or the second user authentication mode according to whether the first touch position matches the second touch position.

The main controller MC may sense a motion of the display device DD when the fingerprint is sensed. The main controller MC may perform the first user authentication mode or the second user authentication mode according to whether the motion of the display device DD is sensed.

Figure 4:
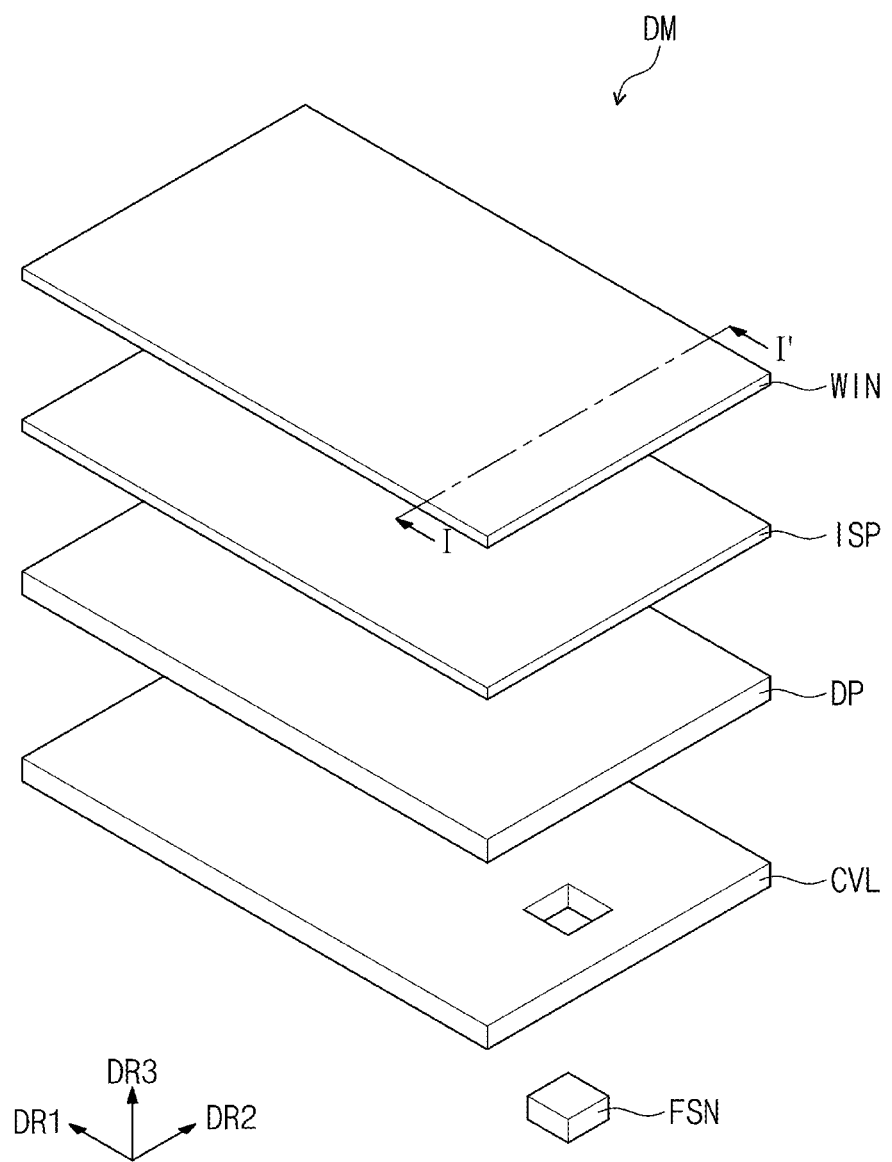
FIG. 4 is an exploded perspective view illustrating a display module of FIG. 3.
Figure 5:
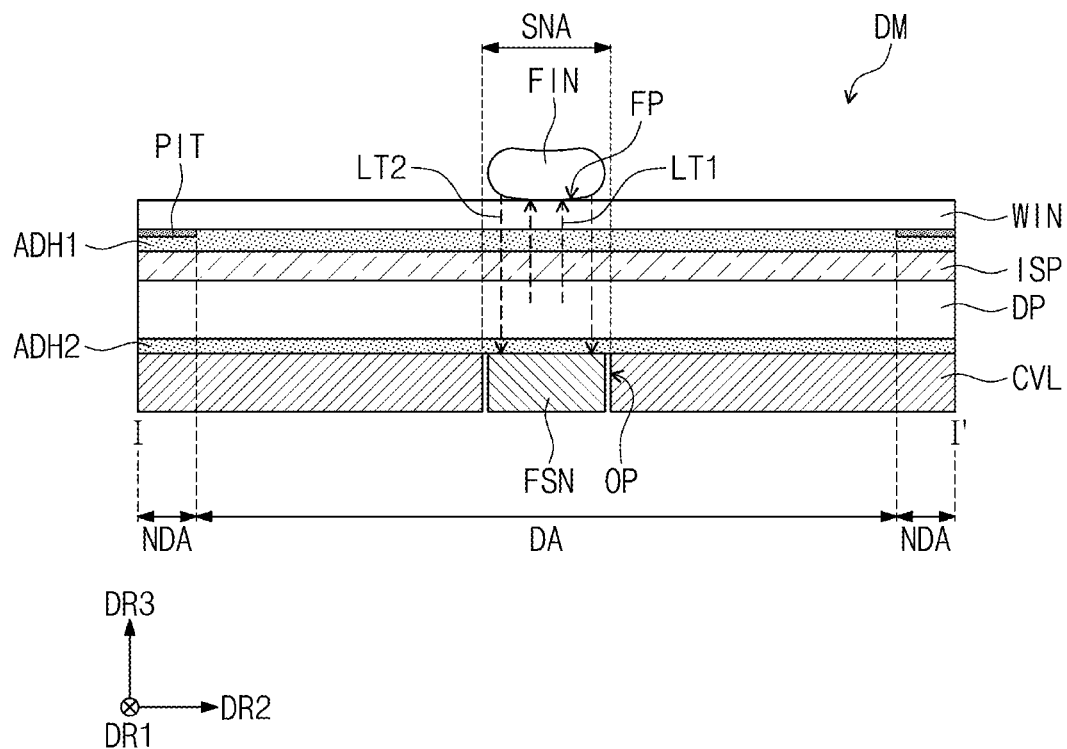
FIG. 5 is a cross-sectional view taken along a line I-I' of FIG. 4.

FIG. 4 is an exploded perspective view illustrating the display module DM of FIG. 3, and FIG. 5 is a cross-sectional view taken along a line I-I' of FIG. 4.

Referring to FIGS. 4 and 5, the display module DM may include the display panel DP, the input sensing part ISP, a window WIN, a printed layer PIT, a cover layer CVL, and the fingerprint sensor FSN. As a representative example, the display panel DP, the input sensing part ISP, the window WIN, the cover layer CVL, and the fingerprint sensor FSN are illustrated assembled with each other in FIG. 5.

The input sensing part ISP may be disposed on the display panel DP, and the window WIN may be disposed on the input sensing part ISP. The cover layer CVL and the fingerprint sensor FSN may be disposed under the display panel DP.

The display panel DP may include a display area DA and a non-display area NDA around the display area DA. The display panel DP may be, but not limited to, a flexible display panel. For example, the display panel DP may include a plurality of electronic elements disposed on a flexible substrate.

The input sensing part ISP may include a plurality of sensor units (not illustrated) to sense the external input. The sensor units may sense the external input using a capacitive method. The input sensing part ISP may be manufactured directly on the display panel DP when the display module DM is manufactured, however, it should not be limited thereto or thereby. That is, the input sensing part ISP may be attached to the display panel DP by an adhesive after being manufactured separately from the display panel DP.

The window WIN may protect the display panel DP and the input sensing part ISP from external scratches and impacts. A first adhesive ADH1 may be disposed between the window WIN and the input sensing part ISP. The window WIN may be attached to the input sensing part ISP by the first adhesive ADH1. The first adhesive ADH1 may include an optically clear adhesive. The image generated by the display panel DP may be provided to the user after passing through the window WIN.

The printed layer PIT may overlap the non-display area NDA and may be disposed on a lower surface of the window WIN facing the input sensing part ISP. The printed layer PIT may not be disposed in the display area DA. The printed layer PIT may have a predetermined color, e.g., a black color. The non-display area NDA may be printed with the predetermined color by the printed layer PIT.

The cover layer CVL may absorb external impacts applied to a lower portion of the display panel DP and may protect the display panel DP. The cover layer CVL may include a foam sheet having a predetermined elasticity. A second adhesive ADH2 may be disposed between the cover layer CVL and the display panel DP. The cover layer CVL may be attached to the display panel DP by the second adhesive ADH2. The second adhesive ADH2 may include a pressure sensitive adhesive.

An opening OP may be defined through the cover layer CVL. The opening OP may be defined in the display area DA. The fingerprint sensor FSN may be disposed in the opening OP to overlap a portion of the display area DA. The fingerprint sensor FSN may include a plurality of optical sensors to sense a fingerprint FP using light. Each of the optical sensors may include a photodiode.

When a finger FIN touches the display module DM, the input sensing part ISP may sense the touch position of the finger FIN. As described above, the touch position may be provided to the main controller MC. The fingerprint FP of the finger FIN may touch the display module DM to be adjacent to the fingerprint sensor FSN.

The display panel DP may include a sensing area SNA disposed on the fingerprint sensor FSN to overlap the fingerprint sensor FSN. A light LT1 generated by the sensing area SNA may be provided to the fingerprint FP and may be reflected as LT2 from the fingerprint FP. The light LT2 reflected from the fingerprint FP may be provided to the fingerprint sensor FSN. The fingerprint sensor FSN may sense the fingerprint FP based on the light LT2 reflected from the fingerprint FP.

Figure 6:
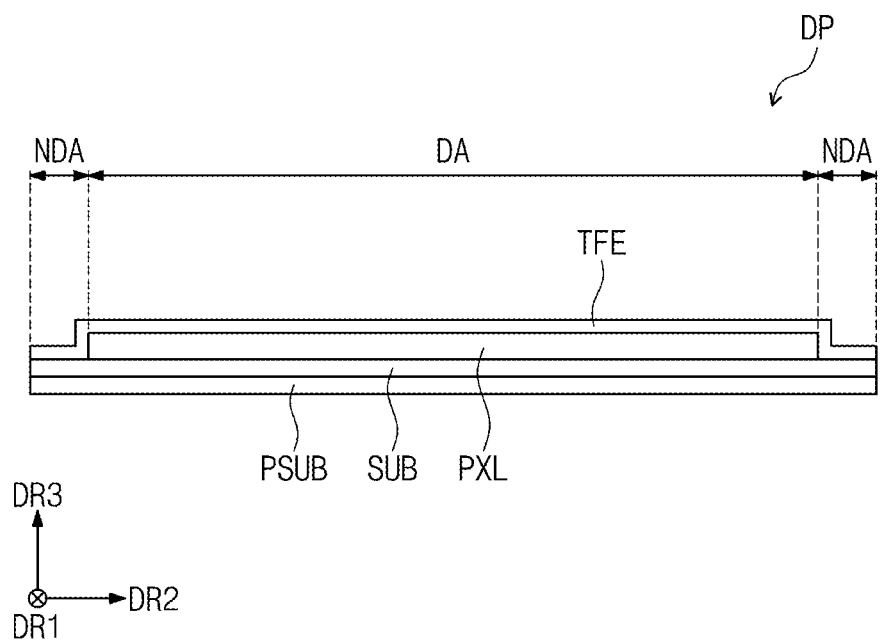
FIG. 6 is a cross-sectional view schematically illustrating a display panel of FIG. 5.

FIG. 6 is a cross-sectional view schematically illustrating the display panel DP of FIG. 5.

Referring to FIG. 6, the display panel DP may include a substrate SUB, a pixel layer PXL disposed on the substrate SUB, and a thin film encapsulation layer TFE disposed on the substrate SUB to cover the pixel layer PXL. The input sensing part ISP may be disposed on the thin film encapsulation layer TFE.

The substrate SUB may include a display area DA and a non-display area NDA around the display area DA. The substrate SUB may include a flexible plastic material. As an example, the substrate SUB may include polyimide (PI). The pixel layer PXL may include a plurality of pixels. The structure of the pixel will be described in detail later.

Figure 7:
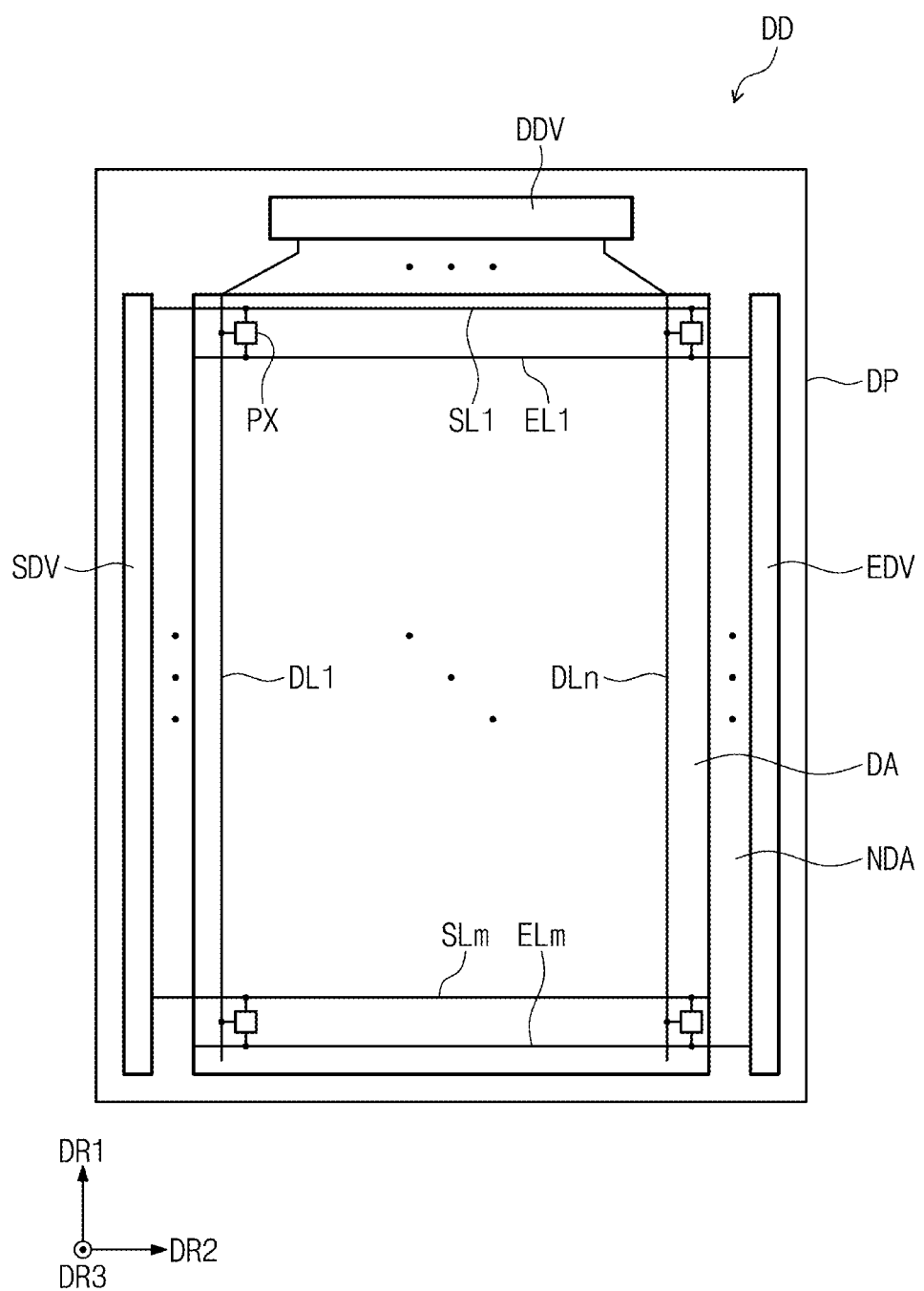
FIG. 7 is a plan view illustrating the display panel of FIG. 6.

FIG. 7 is a plan view illustrating the display panel DP of FIG. 6.

Referring to FIG. 7, the display device DD according to an exemplary embodiment of the inventive concepts may include the display panel DP, a scan driver SDV, a data driver DDV, and an emission driver EDV. The scan driver SDV, the data driver DDV, and the emission driver EDV may be disposed on the display panel DP.

The display panel DP may have the rectangular shape having long sides extending in the first direction DR1 and short sides extending in the second direction DR2. The display panel DP may include the display area DA and the non-display area NDA surrounding the display area DA.

The display panel DP may include a plurality of pixels PX, a plurality of scan lines SL1 to SLm, a plurality of data lines DL1 to DLn, and a plurality of emission lines EL1 to ELm. Each of "m" and "n" is a natural number. The pixels PX may be arranged in a matrix form, however, they should not be limited thereto or thereby. The pixels PX may be arranged in the display area DA and may be connected to the scan lines SL1 to SLM, the data lines DL1 to DLn, and the emission lines EL1 to ELm.

The scan driver SDV, the data driver DDV, and the emission driver EDV may be arranged in the non-display area NDA. The scan driver SDV and the emission driver EDV may be disposed to be respectively adjacent to the long sides of the display panel DP. The data driver DDV may be manufactured in an integrated circuit chip form and may be disposed to be adjacent to one short side of the short sides of the display panel DP.

The scan lines SL1 to SLm may extend in the second direction DR2 and may be connected to the scan driver SDV. The data lines DL1 to DLn may extend in the first direction DR1 and may be connected to the data driver DDV. The emission lines EL1 to ELm may extend in the second direction DR2 and may be connected to the emission driver EDV.

The scan driver SDV may generate a plurality of scan signals, and the scan signals may be applied to the pixels PX through the scan lines SL1 to SLm. The scan signals may be sequentially applied to the pixels PX. The data driver DDV may generate a plurality of data voltages, and the data voltages may be applied to the pixels PX through the data lines DL1 to DLn. The emission driver EDV may generate a plurality of light emitting signals, and the light emitting signals may be applied to the pixels PX through the emission lines EL1 to ELm.

The display panel controller DPC may control an operation of the scan driver SDV, the data driver DDV, and the emission driver EDV.

The pixels PX may receive the data voltages in response to the scan signals. The pixels PX may emit light having luminance corresponding to the data voltages in response to the light emitting signals to display the image. A light emitting time of the pixels PX may be controlled by the light emitting signals.

Figure 8:
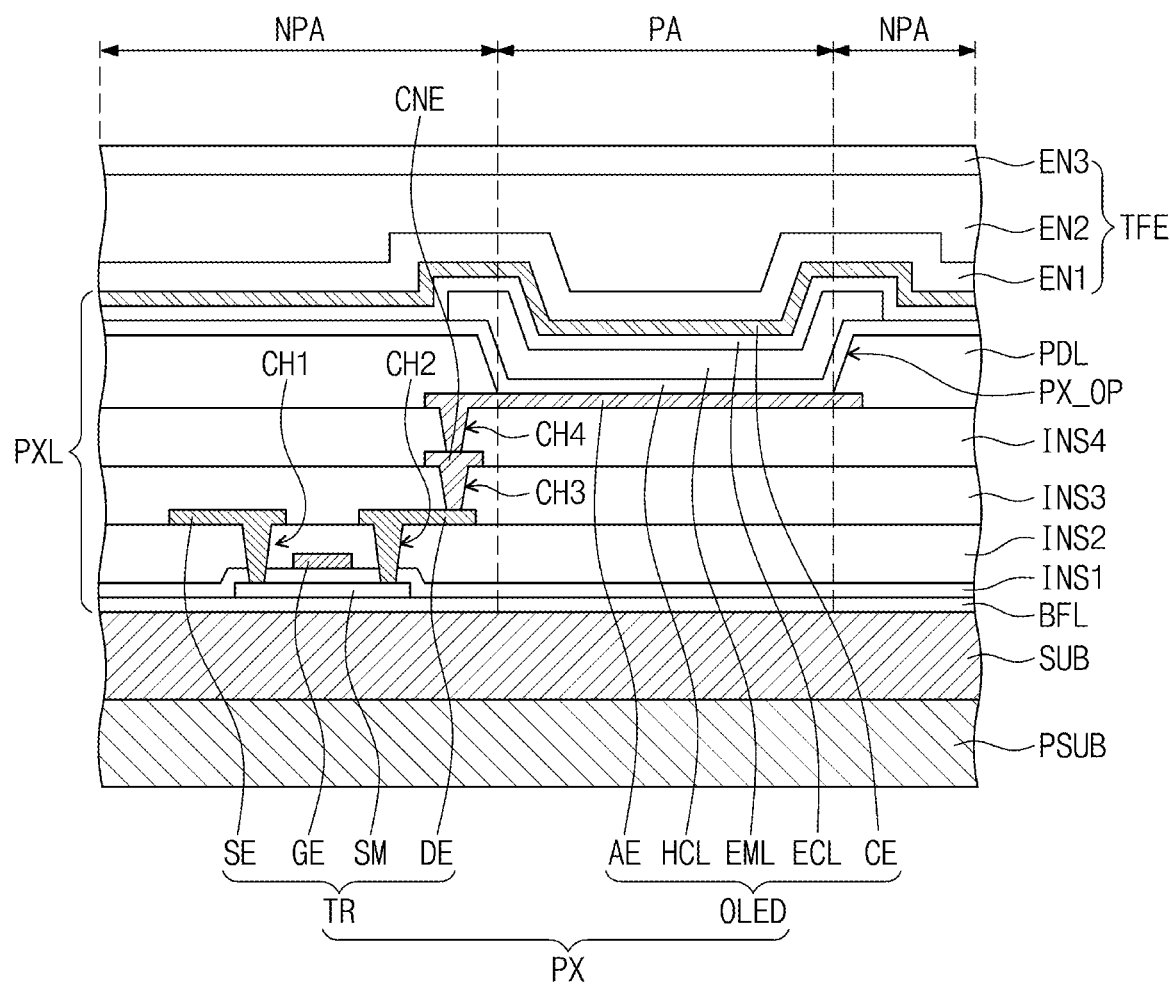
FIG. 8 is a cross-sectional view illustrating a portion corresponding to a pixel of FIG. 7.

FIG. 8 is a cross-sectional view illustrating a portion corresponding to a pixel PX of FIG. 7.

Referring to FIG. 8, the pixel PX may include a light emitting element OLED and a transistor TR connected to the light emitting element OLED. The light emitting element OLED may include a first electrode AE, a second electrode CE, and a hole control layer HCL, an electron control layer ECL, and a light emitting layer EML. The first electrode AE may be an anode electrode, and the second electrode CE may be a cathode electrode.

The transistor TR and the light emitting element OLED may be disposed on the substrate SUB. The substrate SUB may include a light emitting area PA corresponding to each pixel PX and a non-light-emitting area NPA around the light emitting area PA. The light emitting element OLED may be disposed on the light emitting area PA, and the transistor TR may be disposed on the non-light-emitting area NPA. A buffer layer BFL may be disposed on the substrate SUB, and the buffer layer BFL may include an inorganic material.

A semiconductor layer SM of the transistor TR may be disposed on the buffer layer BFL. The semiconductor layer SM may include an inorganic semiconductor, such as amorphous silicon or polycrystalline silicon, or an organic semiconductor. In addition, the semiconductor layer SM may include an oxide semiconductor. Although not illustrated in FIG. 8, the semiconductor layer SM may include a source area, a drain area, and a channel area defined between the source area and the drain area.

A first insulating layer INS1 may be disposed on the buffer layer BFL to cover the semiconductor layer SM. The first insulating layer INS1 may include an inorganic material. A gate electrode GE of the transistor TR may be disposed on the first insulating layer INS1 to overlap the semiconductor layer SM. The gate electrode GE may be disposed to overlap the channel area of the semiconductor layer SM.

A second insulating layer INS2 may be disposed on the first insulating layer INS1 to cover the gate electrode GE. The second insulating layer INS2 may include an organic material and/or an inorganic material.

A source electrode SE and a drain electrode DE of the transistor TR may be disposed on the second insulating layer INS2 to be spaced apart from each other. The source electrode SE may be connected to the source area of the semiconductor layer SM through a first contact hole CH1 defined through the first insulating layer INS1 and the second insulating layer INS2. The drain electrode DE may be connected to the drain area of the semiconductor layer SM through a second contact hole CH2 defined through the first insulating layer INS1 and the second insulating layer INS2.

A third insulating layer INS3 may be disposed on the second insulating layer INS2 to cover the source electrode SE and the drain electrode DE of the transistor TR. The third insulating layer INS3 may include an organic material. A connection electrode CNE may be disposed on the third insulating layer INS3. The connection electrode CNE may be connected to the drain electrode DE through a third contact hole CH3 defined through the third insulating layer INS3.

A fourth insulating layer INS4 may be disposed on the third insulating layer INS3 to cover the connection electrode CNE. The first electrode AE may be disposed on the fourth insulating layer INS4. The first electrode AE may be connected to the connection electrode CNE through a fourth contact hole CH4 defined through the fourth insulating layer INS4.

A pixel definition layer PDL may be disposed on the first electrode AE and the fourth insulating layer INS4 to expose a predetermined portion of the first electrode AE. An opening PX_OP may be defined through the pixel definition layer PDL to expose the predetermined portion of the first electrode AE.

The hole control layer HCL may be disposed on the first electrode AE and the pixel definition layer PDL. The hole control layer HCL may be commonly disposed in the light emitting area PA and the non-light-emitting area NPA. The hole control layer HCL may include a hole transport layer and may further include a hole injection layer.

The light emitting layer EML may be disposed on the hole control layer HCL. The light emitting layer EML may be disposed in an area corresponding to the opening PX_OP. That is, the light emitting layer EML may be formed in each of the pixels PX after being divided into portions. The light emitting layer EML may include an organic material and/or an inorganic material. The light emitting layer EML may generate a light having one of red, green, and blue colors, however, it should not be limited thereto or thereby. The light emitting layer EML may generate a white light by a combination of organic materials respectively generating the red, green, and blue colors.

The electron control layer ECL may be disposed on the light emitting layer EML. The electron control layer ECL may be disposed on the hole control layer HCL to cover the light emitting layer EML. That is, the electron control layer ECL may be commonly disposed in the light emitting area PA and the non-light-emitting area NPA. The electron control layer ECL may include an electron transport layer and may further include an electron injection layer.

The second electrode CE may be disposed on the electron control layer ECL. The second electrode CE may be commonly disposed in the pixels PX. The thin film encapsulation layer TFE may be disposed on the second electrode CE. A layer disposed between the substrate SUB and the thin film encapsulation layer TFE may be referred to as the pixel layer PXL.

The thin film encapsulation layer TFE may include a first encapsulation layer EN1 disposed on the second electrode CE, a second encapsulation layer EN2 disposed on the first encapsulation layer EN1, and a third encapsulation layer EN3 disposed on the second encapsulation layer EN2. The first and third encapsulation layers EN1 and EN3 may include an inorganic material and may protect the pixel layer PXL from moisture/oxygen. The second encapsulation layer EN2 may include an organic material and may protect the pixel layer PXL from a foreign substance such as dust particles.

A protective substrate PSUB may be disposed under the substrate SUB. The protective substrate PSUB may protect a lower portion of the substrate SUB. The protective substrate PSUB may include a flexible plastic material. For example, the protective substrate PSUB may include polyethylene terephthalate (PET).

A first voltage may be applied to the first electrode AE, and a second voltage, which has a voltage level lower than that of the first voltage, may be applied to the second electrode CE. Holes and electrons injected into the light emitting layer EML may be recombined to generate excitons, and the light emitting element OLED may emit the light by the excitons that return to a ground state from an excited state. The light emitting element OLED may emit the light, so that the image may be displayed.

Figure 9:
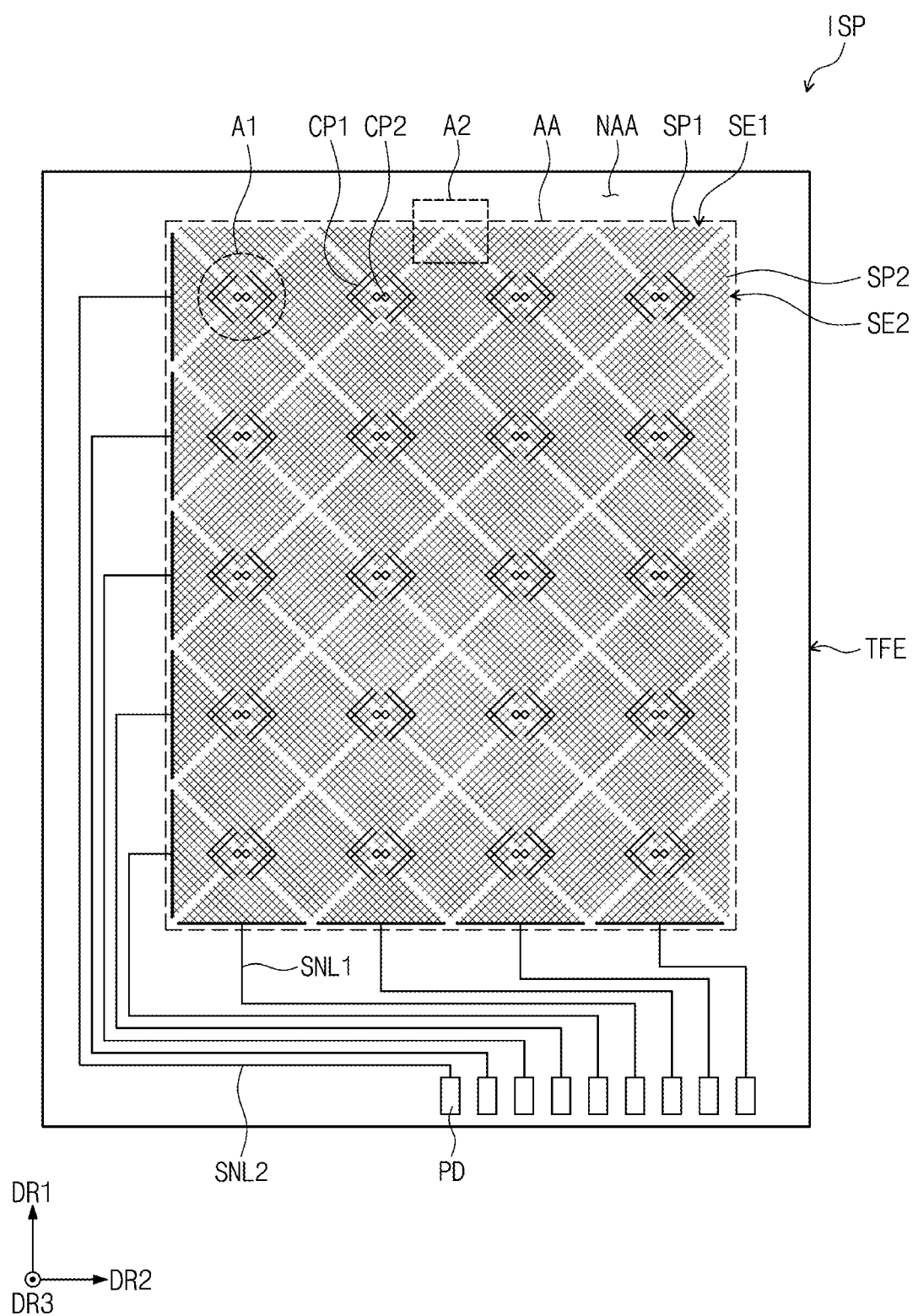
FIG. 9 is a plan view illustrating an input sensing part of FIG. 4.

FIG. 9 is a plan view illustrating the input sensing part ISP of FIG. 4.

Referring to FIG. 9, the input sensing part ISP may include a plurality of sensing electrodes SE1 and SE2, a plurality of signal lines SNL1 and SNL2, and a plurality of pads PD. The sensing electrodes SE1 and SE2, the signal lines SNL1 and SNL2, and the pads PD may be disposed on the thin film encapsulation layer TFE.

The input sensing part ISP may include an active area AA and a non-active area NAA surrounding the active area AA when viewed in a plane. The sensing electrodes SE1 and SE2 may be arranged in the active area AA, and the pads PD may be arranged in the non-active area NAA. The signal lines SNL1 and SNL2 may be connected to one ends of the sensing electrodes SE1 and SE2 and may extend in the non-active area NAA to be connected to the pads PD. The pads PD may be connected to the input sensing controller ISC via a flexible printed circuit board.

The sensing electrodes SE1 and SE2 may include a plurality of first sensing electrodes SE1 extending in the first direction DR1 and arranged in the second direction DR2 and a plurality of second sensing electrodes SE2 extending in the second direction DR2 and arranged in the first direction DR1. The signal lines SNL1 and SNL2 may include a plurality of first signal lines SNL1 connected to the first sensing electrodes SE1 and a plurality of second signal lines SNL2 connected to the second sensing electrodes SE2.

The second sensing electrodes SE2 may extend to be insulated from the first sensing electrodes SE1 while crossing the first sensing electrodes SE1. The first sensing electrodes SE1 may be defined as output sensing electrodes, and the second sensing electrodes SE2 may be defined as input sensing electrodes.

Each of the first sensing electrodes SE1 may include a plurality of first sensor portions SP1 arranged in the first direction DR1 and a plurality of first connection portions CP1 connecting the first sensor portions SP1. Each of the first connection portions CP1 may be disposed between two first sensor portions SP1 adjacent to each other in the first direction DR1 and may electrically connect the two first sensor portions SP1.

Each of the second sensing electrodes SE2 may include a plurality of second sensor portions SP2 arranged in the second direction DR2 and a plurality of second connection portions CP2 connecting the second sensor portions SP2. Each of the second connection portions CP2 may be disposed between two second sensor portions SP2 adjacent to each other in the second direction DR2 and may electrically connect the two second sensor portions SP2.

The first sensor portions SP1 and the second sensor portions SP2 may have a mesh shape. The first sensor portions SP1 and the second sensor portions SP2 may not overlap each other, may be spaced apart from each other, and may be alternately arranged with each other. A capacitance may be formed by the first sensor portions SP1 and the second sensor portions SP2. The second connection portions CP2 may not overlap the first connection portions CP1.

The first and second sensor portions SP1 and SP2 and the second connection portions CP2 may be disposed on the same layer. The first connection portions CP1 may be disposed on a layer different from the layer on which the first and second sensor portions SP1 and SP2 and the second connection portions CP2 are disposed.

Figure 10:
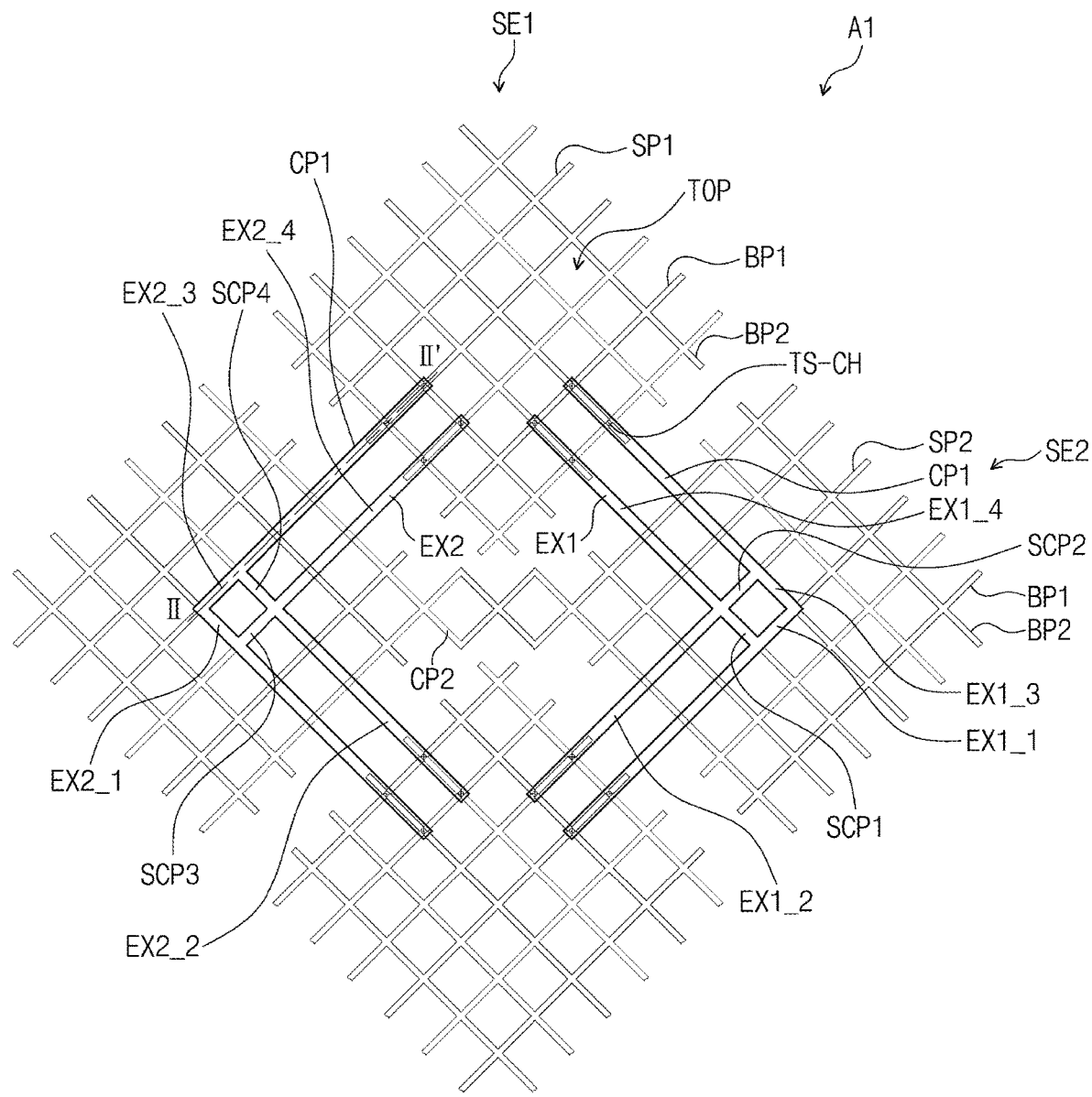
FIG. 10 is an enlarged view illustrating a first area of FIG. 9.
Figure 10:
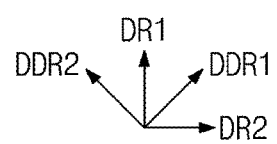
Figure 11:
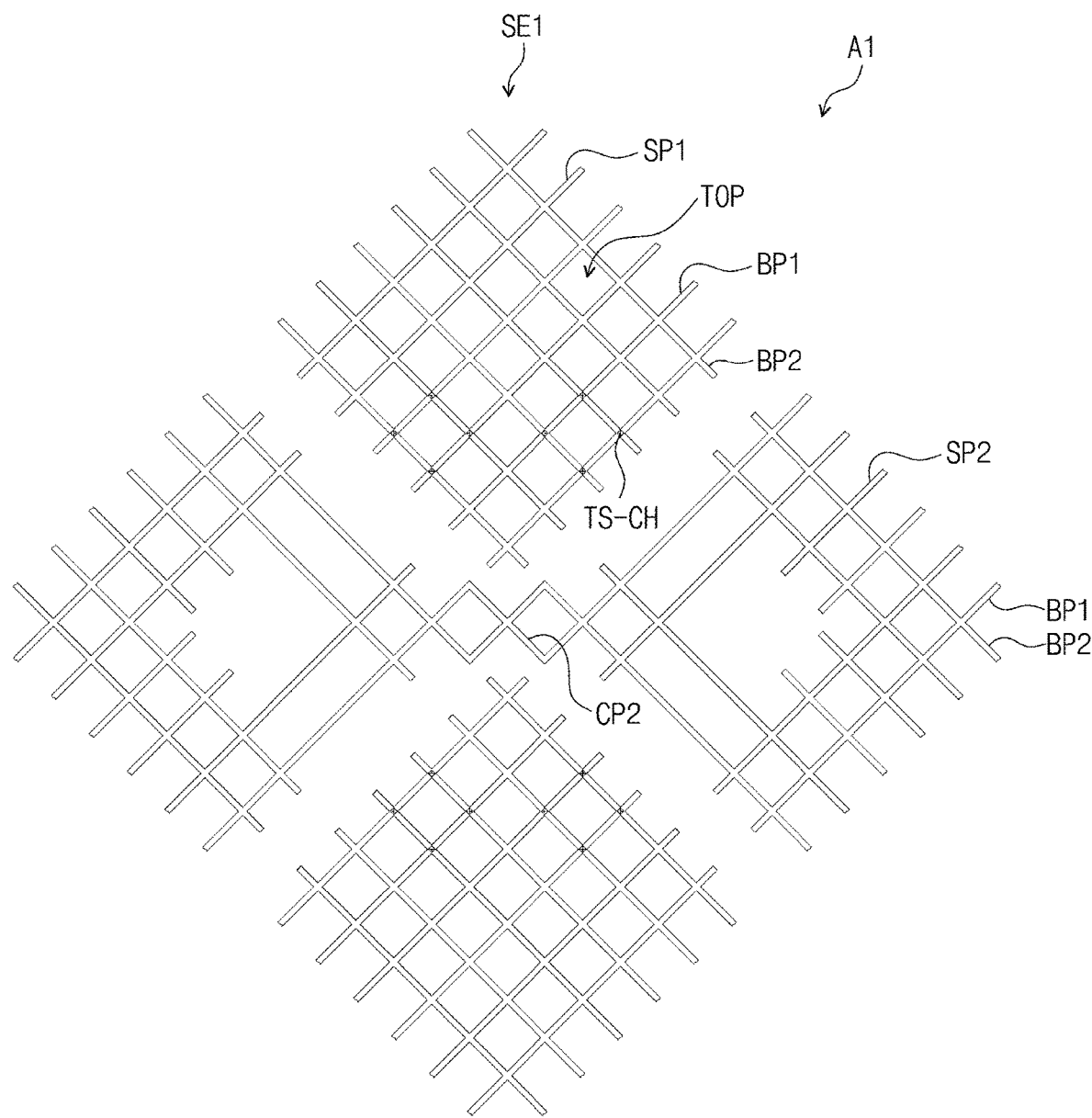
FIG. 11 is a view illustrating only first and second sensor portions and a second connection portion of FIG. 10.
Figure 11:
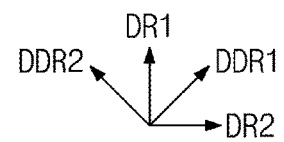
Figure 12:
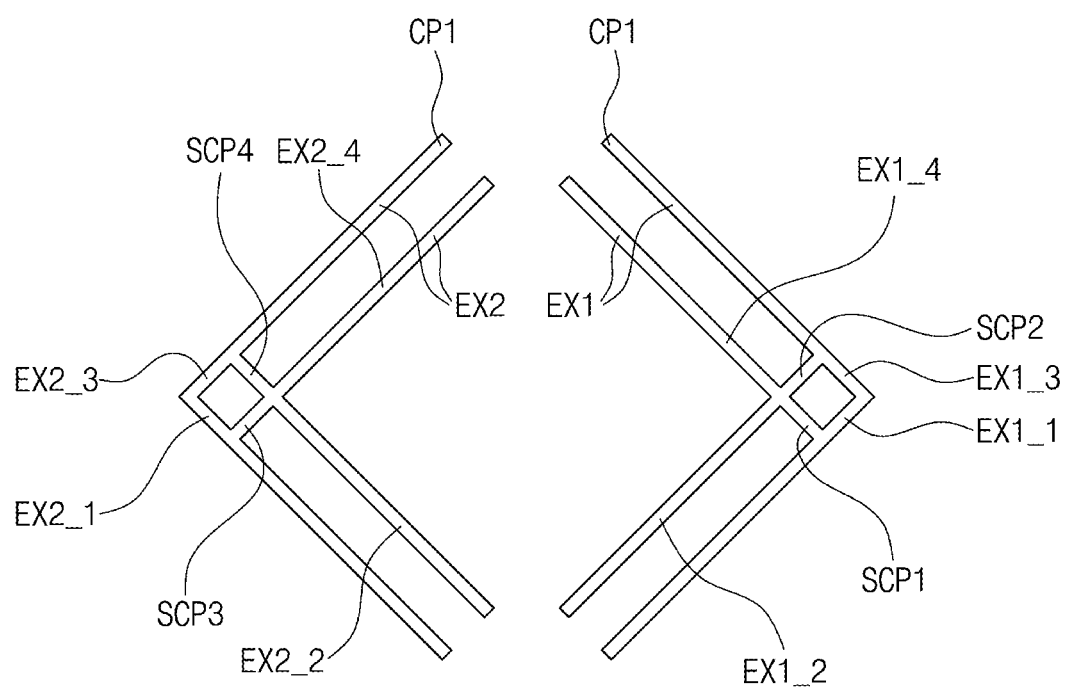
FIG. 12 is a view illustrating only a first connection portion of FIG. 10.

FIG. 10 is an enlarged view illustrating a first area A1 of FIG. 9. FIG. 11 is a view illustrating only the first and second sensor portions SP1 and SP2 and the second connection portion CP2 of FIG. 10. FIG. 12 is a view illustrating only the first connection portion CP1 of FIG. 10.

FIG. 10 illustrates two first sensor portions SP1 adjacent to each other and two second sensor portions SP2 adjacent to each other as a representative example.

Referring to FIGS. 10, 11, and 12, each of the first and second sensor portions SP1 and SP2 may include a plurality of first branch portions BP1 extending in a first diagonal direction DDR1 and a plurality of second branch portions BP2 extending in a second diagonal direction DDR2 and may have a mesh shape.

The first diagonal direction DDR1 may be a direction crossing the first and second directions DR1 and DR2 on the plane defined by the first and second directions DR1 and DR2. The second diagonal direction DDR2 may be a direction crossing the first diagonal direction DDR1 on the plane defined by the first and second directions DR1 and DR2. As an example, the first direction DR1 and the second direction DR2 may perpendicularly cross each other, and the first diagonal direction DDR1 and the second diagonal direction DDR2 may perpendicularly cross each other.

The first branch portions BP1 of each of the first and second sensor portions SP1 and SP2 may cross the second branch portions BP2 and may be integrally formed with each other. Touch openings TOP having a lozenge shape may be defined by the first branch portions BP1 and the second branch portions BP2.

The first connection portion CP1 may extend not to overlap the second connection portion CP2 and may electrically connect the two first sensor portions SP1 adjacent to each other. The first connection portion CP1 may be connected to the first sensor portions SP1 through a plurality of contact holes TS-CH. The first connection portion CP1 may extend to the first sensor portions SP1 via predetermined portions of the two second sensor portions SP2 adjacent to each other.

The second connection portion CP2 may electrically connect the second sensor portions SP2. The second sensor portions SP2 and the second connection portion CP2 may be integrally formed with each other. The second connection portion CP2 may have a mesh shape and may extend from the second sensor portions SP2. The second connection portion CP2, the first sensor portions SP1, and the second sensor portions SP2 may be formed of the same material and may be substantially simultaneously patterned.

The first connection portion CP1 may include a first extension portion EX1 and a second extension portion EX2 having a shape symmetrical with respect to the first extension portion EX1. The second connection portion CP2 may be disposed between the first extension portion EX1 and the second extension portion EX2. The first extension portion EX1 may extend through one second sensor portion SP2 among the second sensor portions SP2 and may be connected to the first sensor portions SP1. The second extension portion EX2 may extend through another second sensor portion SP2 among the second sensor portions SP2 and may be connected to the first sensor portions SP1.

Hereinafter, the first sensor portions SP1 in FIGS. 10 and 11 may be referred to as an upper first sensor portion SP1 and a lower first sensor portion SP1 depending on a relative arrangement position. In addition, the second sensor portions SP2 in FIGS. 10 and 11 may be referred to as a left second sensor portion SP2 and a right second sensor portion SP2 depending on a relative arrangement position.

Predetermined portions of the first and second extension portions EX1 and EX2, which are adjacent to one sides of the first and second extension portions EX1 and EX2, may be connected to the lower first sensor portion SP1 through the contact holes TS-CH. Predetermined portions of the first and second extension portions EX1 and EX2, which are adjacent to the other sides of the first and second extension portions EX1 and EX2, may be connected to the upper first sensor portion SP1 through the contact holes TS-CH. The contact holes TS-CH may be defined through an insulating layer disposed on the first connection portion CP1, and a shape of the contact holes TS-CH will be described with reference to FIG. 13.

The first extension portion EX1 may include a first sub-extension portion EX1_1 and a second sub-extension portion EX1_2, which extend in the first diagonal direction DDR1, a third sub-extension portion EX1_3 and a fourth sub-extension portion EX1_4, which extend in the second diagonal direction DDR2, a first sub-connection portion SCP1 extending in the second diagonal direction DDR2, and a second sub-connection portion SCP2 extending in the first diagonal direction DDR1.

Predetermined portions of the first and second sub-extension portions EX1_1 and EX1_2, which are adjacent to one sides of the first and second sub-extension portions EX1_1 and EX1_2, may be connected to the lower first sensor portion SP1 through the contact holes TS-CH. Predetermined portions of the third and fourth sub-extension portions EX1_3 and EX1_4, which are adjacent to one sides of the third and fourth sub-extension portions EX1_3 and EX1_4, may be connected to the upper first sensor portion SP1 through the contact holes TS-CH.

The other side of the first sub-extension portion EX1_1 may be connected to the other side of the third sub-extension portion EX1_3, and the other side of the second sub-extension portion EX1_2 may be connected to the other side of the fourth sub-extension portion EX1_4. The first sub-connection portion SCP1 may extend in the second diagonal direction DDR2 from the other side of the fourth sub-extension portion EX1_4 and may be connected to the first sub-extension portion EX1_1. The second sub-connection portion SCP2 may extend in the first diagonal direction DDR1 from the other side of the second sub-extension portion EX1_2 and may be connected to the third sub-extension portion EX1_3.

The first sub-extension portion EX1_1, the second sub-extension portion EX1_2, the third sub-extension portion EX1_3, the fourth sub-extension portion EX1_4, the first sub-connection portion SCP1, and the second sub-connection portion SCP2 may be integrally formed with each other.

The first and second sub-extension portions EX1_1 and EX1_2 may extend to cross a predetermined number of the second branch portions BP2 adjacent to the lower first sensor portion SP1 among the second branch portions BP2 of the right second sensor portion SP2. As illustrated in FIG. 11, the first branch portions BP1 of the right second sensor portion SP2 may not be disposed in an area that overlaps the first and second sub-extension portions EX1_1 and EX1_2 and the second sub-connection portion SCP2.

The third and fourth sub-extension portions EX1_3 and EX1_4 may extend to cross a predetermined number of the first branch portions BP1 adjacent to the upper first sensor portion SP1 among the first branch portions BP1 of the right second sensor portion SP2. As illustrated in FIG. 11, the second branch portions BP2 of the right second sensor portion SP2 may not be disposed in an area that overlaps the third and fourth sub-extension portions EX1_3 and EX1_4 and the first sub-connection portion SCP1.

The second extension portion EX2 may include a fifth sub-extension portion EX2_1 and a sixth sub-extension portion EX2_2, which extend in the second diagonal direction DDR2, a seventh sub-extension portion EX2_3 and an eighth sub-extension portion EX2_4, which extend in the first diagonal direction DDR1, a third sub-connection portion SCP3 extending in the first diagonal direction DDR1, and a fourth sub-connection portion SCP4 extending in the second diagonal direction DDR2.

The left second sensor portion SP2 may have a structure symmetrical with respect to the right second sensor portion SP2, and the second extension portion EX2 may have a structure symmetrical with respect to the first extension portion EX1. Accordingly, the fifth to eighth sub-extension portions EX2_1 to EX2_4 may connect the first sensor portions SP1 via the left second sensor portion SP2. In addition, predetermined portions of the fifth to eighth sub-extension portions EX2_1 to EX2_4 may connect the first sensor portions SP1 through the contact holes TS-CH.

The fifth to eighth sub-extension portions EX2_1 to EX2_4 may cross some first and second branch portions BP1 and BP2 of the left second sensor portion SP2. In addition, the first and second branch portions BP1 and BP2 of the left second sensor portion SP2 may not be disposed in some areas that overlap the fifth to eighth sub-extension portions EX2_1 to EX2_4 and the third and fourth sub-connection portions SCP3 and SCP4.

Figure 13:
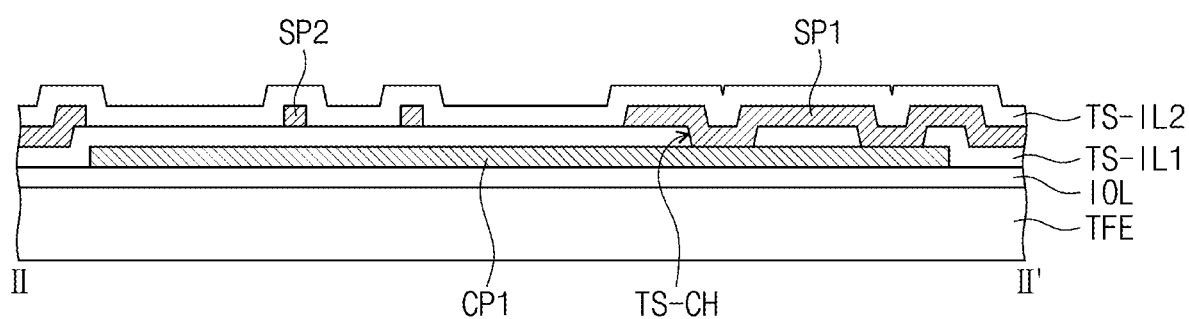
FIG. 13 is a cross-sectional view taken along a line II-IF of FIG. 10.

FIG. 13 is a cross-sectional view taken along a line II-IF illustrated in FIG. 10.

Referring to FIG. 13, an inorganic insulating layer IOL may be disposed on the thin film encapsulation layer TFE, and the first connection portion CP1 may be disposed on the inorganic insulating layer IOL. A first insulating layer TS-IL1 may be disposed on the thin film encapsulation layer TFE to cover the first connection portion CP1. The first insulating layer TS-IL1 may include an inorganic material.

The first sensor portions SP1 and the second sensor portions SP2 may be disposed on the first insulating layer TS-IL1. The second connection portion CP2 integrally formed with the second sensor portions SP2 may be disposed on the first insulating layer TS-IL1. The first connection portion CP1 may be connected to the first sensor portions SP1 through the contact holes TS-CH defined through the first insulating layer TS-IL1. A second insulating layer TS-IL2 may be disposed on the first insulating layer TS-IL1 to cover the first sensor portions SP1 and the second sensor portions SP2. The second insulating layer TS-IL2 may include an organic material.

Figure 14:
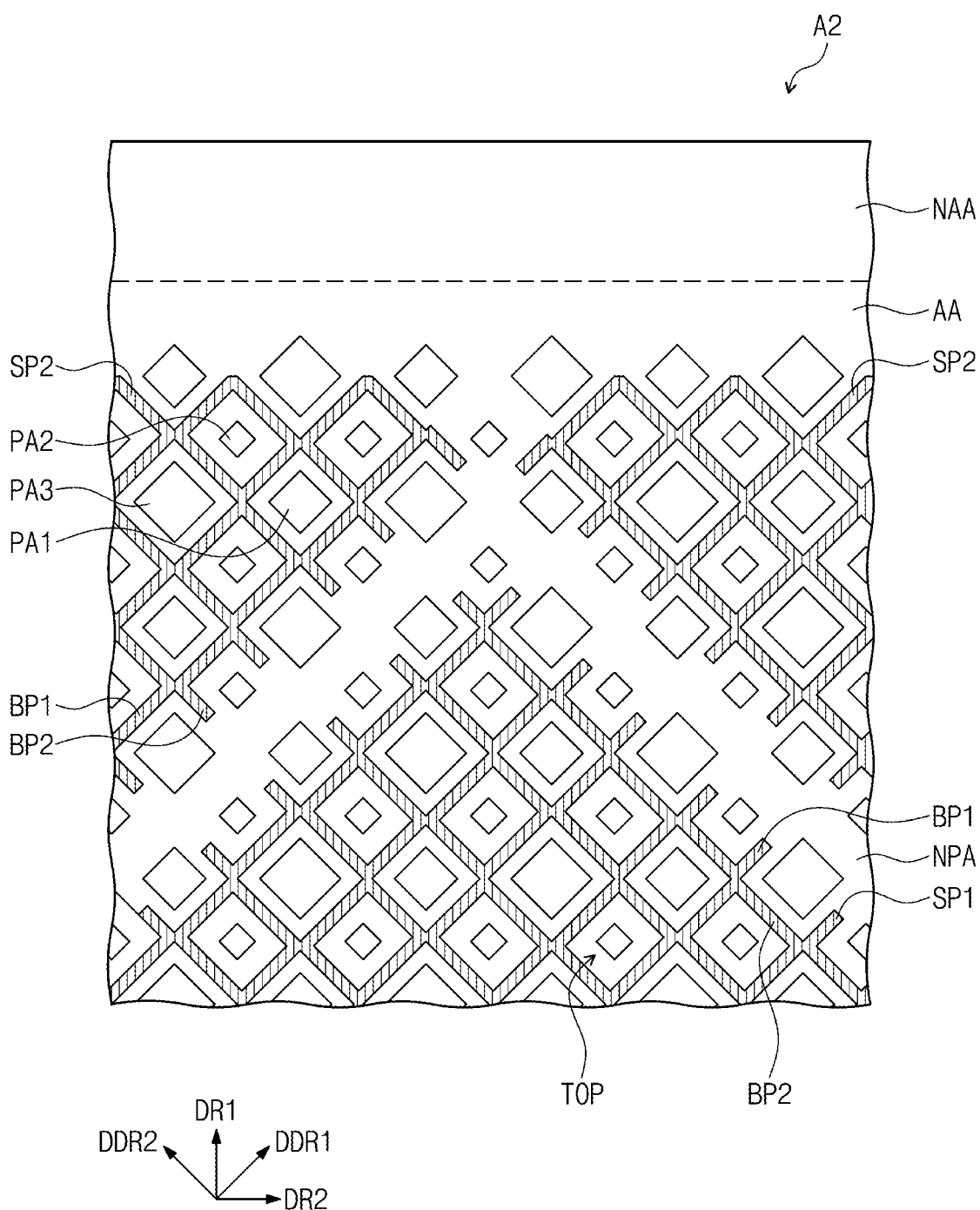
FIG. 14 is an enlarged view illustrating a second area of FIG. 9.

FIG. 14 is an enlarged view illustrating a second area A2 of FIG. 9.

FIG. 14 illustrates light emitting areas PA1, PA2, and PA3 with the first and second sensor portions SP1 and SP2.

Referring to FIG. 14, the light emitting area PA illustrated in FIG. 8 may be one of the light emitting areas PA1, PA2, and PA3. The light emitting areas PA1, PA2, and PA3 may be arranged in the first diagonal direction DDR1 and the second diagonal direction DDR2. The first and second branches BP1 and BP2 of the first and second sensor portions SP1 and SP2 may overlap the non-light-emitting area NPA between the light emitting areas PA1, PA2, and PA3.

The light emitting areas PA1, PA2, and PA3 may include a plurality of first light emitting areas PA1 displaying a red color, a plurality of second light emitting areas PA2 displaying a green color, and a plurality of third light emitting areas PA3 displaying a blue color. The third light emitting areas PA3 may be greater than the first light emitting areas PA1, and the first light emitting areas PA1 may be greater than the second light emitting areas PA2.

The light emitting areas PA1, PA2, and PA3 may have a lozenge shape. The light emitting area PA illustrated in FIG. 8 may be one of the light emitting areas PA1, PA2, and PA3. The touch openings TOP may have a lozenge shape corresponding to the shape of the light emitting areas PA1, PA2, and PA3 and may have a size corresponding to the size of the light emitting areas PA1, PA2, and PA3.

Because the first and second sensor portions SP1 and SP2 are disposed in the non-light-emitting area NPA, the light generated by the light emitting areas PA1, PA2, and PA3 may be normally emitted without being affected by the first and second sensor portions SP1 and SP2.

Figure 15:
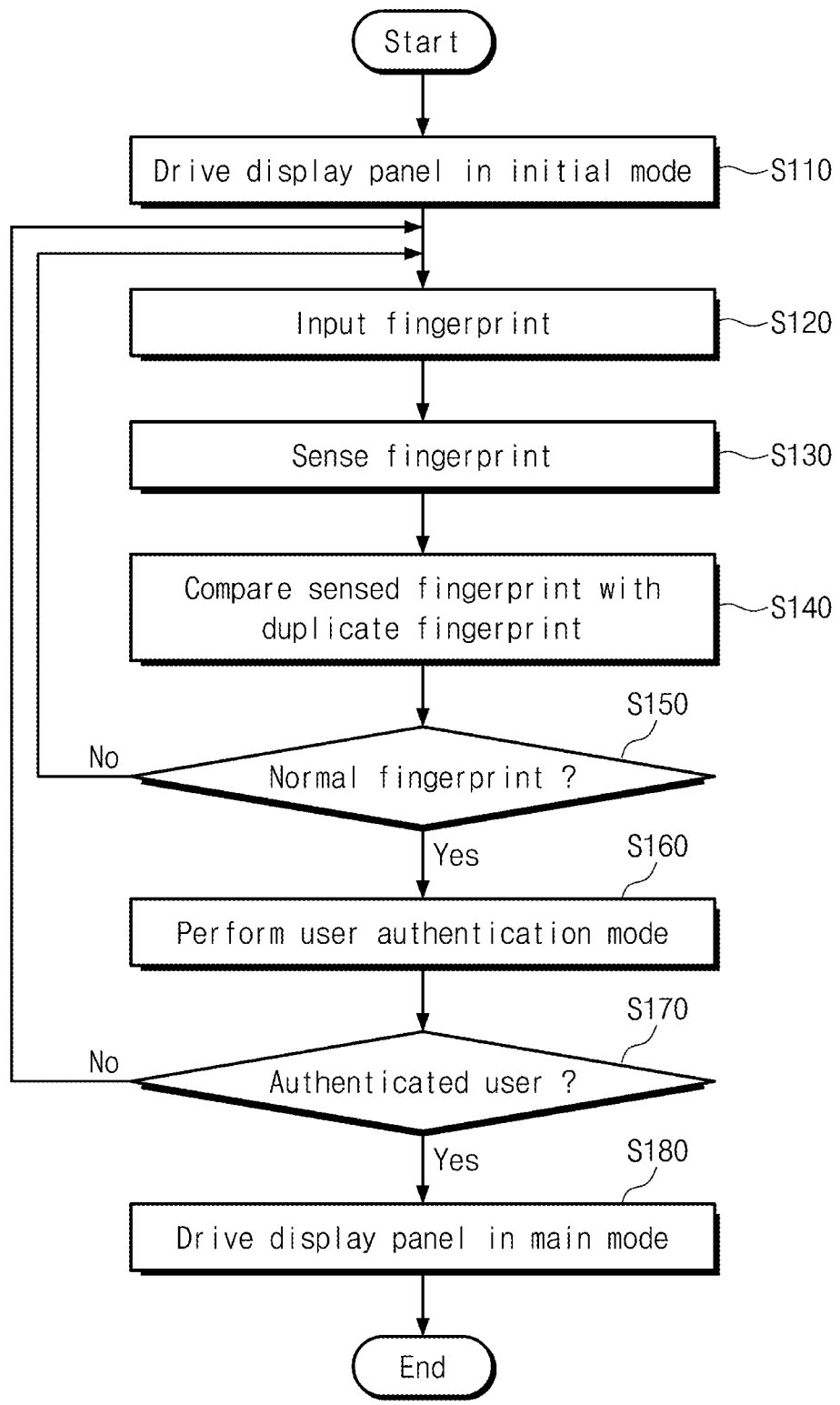
FIG. 15 is a flowchart illustrating a method of driving a display device according to an exemplary embodiment of the inventive concepts.
Figure 16:
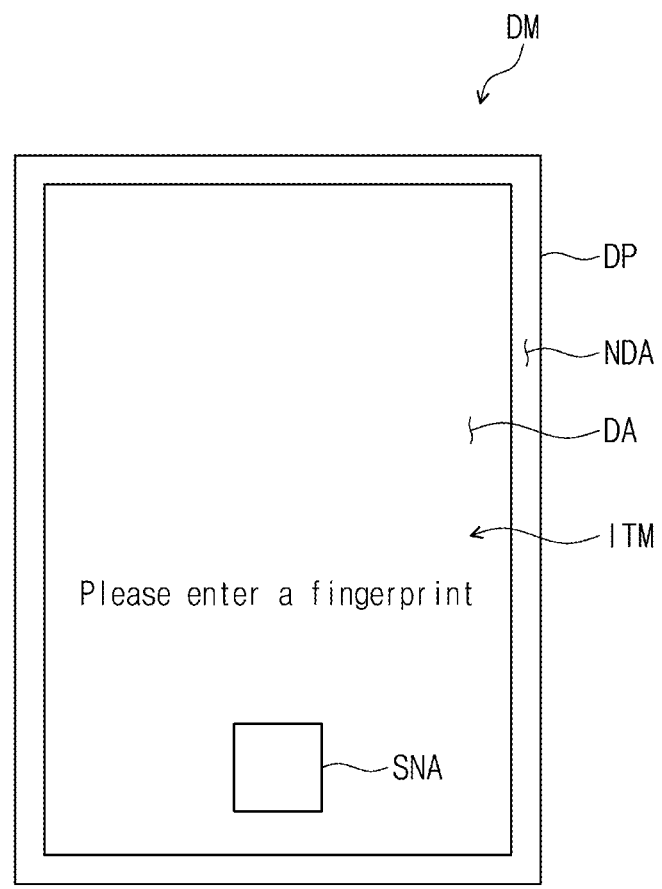
FIG. 16 is a view illustrating an initial mode of a display module.
Figure 17:
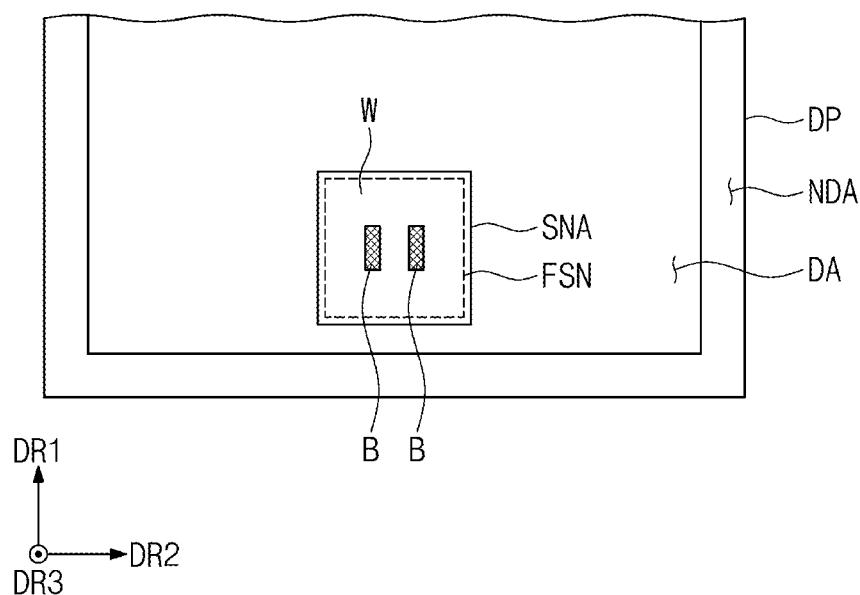
FIG. 17 is a view illustrating a driving state of a sensing area of a display panel of FIG. 16.

FIG. 15 is a flowchart illustrating a method of driving the display device according to an exemplary embodiment of the inventive concepts. FIG. 16 is a view illustrating the initial mode of the display module. FIG. 17 is a view illustrating a driving state of the sensing area of the display panel of FIG. 16.

Referring to FIGS. 15 and 16, the display panel DP may be driven in the initial mode (S110). The display module DM may be touched to drive the display module DM in the initial mode. For example, when the user touches the display module DM in an off state, the display module DM may be turned on in response to the touch event by the user.

The display panel DP of the turned-on display module DM may display an initial image ITM as an image corresponding to the initial mode, and a fingerprint input may be required in the initial mode. For example, the display panel DP may display an instruction message such as "Please enter a fingerprint" in the initial mode, and the sensing area SNA may be activated.

Referring to FIGS. 16 and 17, the sensing area SNA may be defined in the display area DA, and the fingerprint sensor FSN may be disposed under the sensing area SNA. As an example, the fingerprint sensor FSN is illustrated by a dotted line in FIG. 17.

When the display panel DP is driven in the initial mode, the control module CM may drive the sensing area SNA as a first color pattern W and a second color pattern B, which have different colors from each other. In an exemplary embodiment of the inventive concepts, a light transmittance of the first color pattern W may be higher than a light transmittance of the second color pattern B. For example, the first color pattern W may have a white color, and the second color pattern B may have a black color, however, the colors are not be limited thereto or thereby. That is, the first color pattern W may have a color other than the white color, and the second color pattern B may have a color other than the black color.

The first color pattern W may be disposed around the second color pattern B. The second color pattern B may include a plurality of black areas extending in the first direction DR1 and arranged in the second direction DR2.

Each of the black areas B may have a rectangular shape. The first color pattern W may be disposed around each of the black areas B.

Referring to FIG. 15, the fingerprint may be input (S120). For example, the finger may touch the display module DM to input the fingerprint. The fingerprint sensor FSN may receive the light reflected by the fingerprint to sense the fingerprint (S130).

The control module CM may compare the sensed fingerprint with the duplicate fingerprint (S140). For example, the output value of the sensed fingerprint may be compared with the reference value defined by the value output from the fingerprint sensor FSN when the duplicate (fake) fingerprint is sensed. This operation will be described in detail below.

In operation S150, it is determined that whether the sensed fingerprint is the normal fingerprint. When it is determined that the sensed fingerprint is the normal fingerprint in operation S150, the driving method proceeds to operation S160, and the user authentication mode may be performed by the control module CM. The normal fingerprint may be a fingerprint from a real finger. When it is determined that the sensed fingerprint is the duplicate fingerprint in operation S150, the driving method proceeds to operation S120, and the re-entry of the fingerprint may be required. Accordingly, unauthorized access, such as the duplicate fingerprint, may be blocked.

When the user authentication mode is performed in operation S160, the control module CM may compare the sensed fingerprint with the stored user's fingerprint. The stored user's fingerprint may be a fingerprint of the owner of the display device DD.

When the sensed fingerprint is authenticated as the user's fingerprint because the sensed fingerprint matches the stored user's fingerprint in operation S170, the driving method proceeds to operation S180, and the display panel DP may be driven in the main mode. When the sensed fingerprint is not authenticated as the user's fingerprint because the sensed fingerprint does not match the stored user's fingerprint in operation S170, the driving method proceeds to operation S120, and the re-entry of the fingerprint may be required.

The driving method of the display device DD according to exemplary embodiments of the inventive concepts performs the user authentication mode after determining whether the fingerprint is the duplicate fingerprint, and thus, the authentication security of the display device DD may be enhanced. Hereinafter, the operation to determine whether the fingerprint is the duplicate fingerprint will be described in more detail.

Figure 18:
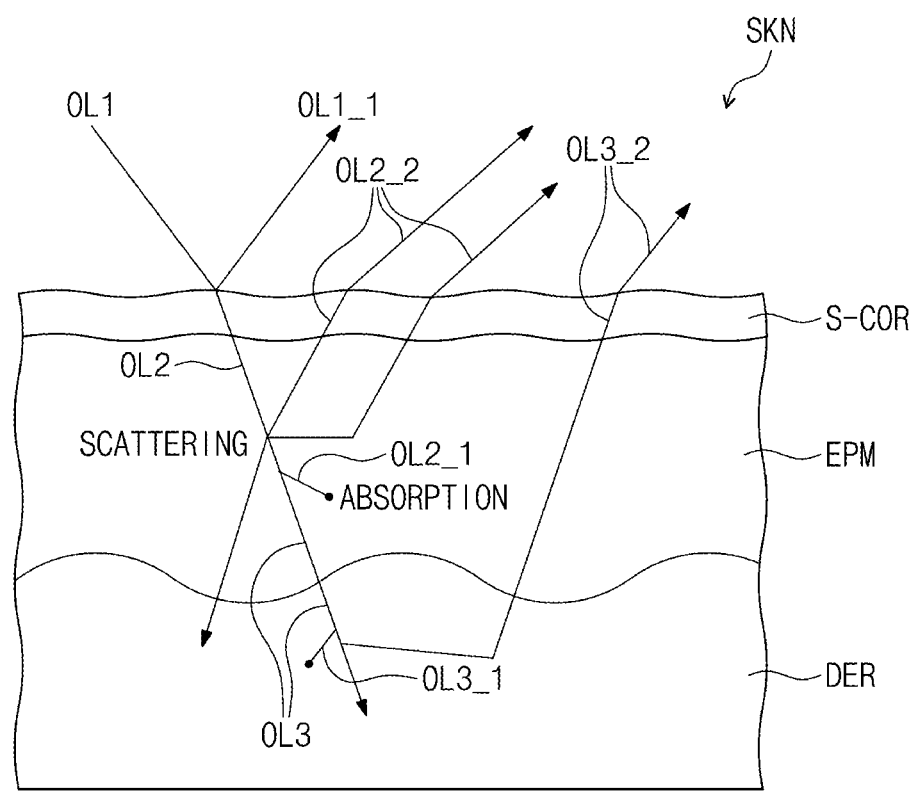
FIG. 18 is a view illustrating paths of lights provided to a skin.

FIG. 18 is a view illustrating paths of lights provided to a user's skin.

Referring to FIG. 18, the skin SKN may include a stratum corneum (horny layer) S-COR, an epidermal layer EPM below the stratum corneum S-COR, and a dermal layer DER below the epidermal layer EPM. A first reflected external light OL1_1 corresponding to a portion of a first external light OL1 provided to the skin SKN may be reflected from a surface of the skin SKN. A second external light OL2 corresponding to a portion of the first external light OL1 may travel to the epidermal layer EPM inside the skin SKN after passing through the surface of the skin SKN.

The second external light OL2 traveling to the epidermal layer EPM may be scattered by the epidermal layer EPM. A third external light OL3 corresponding to a portion of the second external light OL2 may travel to the dermal layer DER inside the skin SKN after transmitting through the epidermal layer EPM. A second absorbed external light OL2_1 corresponding to a portion of the second external light OL2 may be absorbed by the epidermal layer EPM. A second reflected external light OL2_2 corresponding to a portion of the second external light OL2 may travel to the outside of the skin SKN after being reflected on the epidermal layer EPM and transmitting through the surface of the skin SKN again. A point where the first external light OL1 enters the skin SKN and a point where the second reflected external light OL2_2 exits to the skin SKN may be different from each other.

The third external light OL3 traveling to the dermal layer DER may be scattered by the dermal layer DER. A third absorbed external light OL3_1 corresponding to a portion of the third external light OL3 may be absorbed by the dermal layer DER. A third reflected external light OL3_2 corresponding to a portion of the third external light OL3 may be reflected from the dermal layer DER, may transmit through the surface of the skin SKN, and then may travel to the outside of the skin SKN. A point where the first external light OL1 enters the skin SKN and a point where the third reflected external light OL3_2 exits to the outside of the skin SKN may be different from each other.

Therefore, some of the second and third reflected external lights OL2_2 and OL3_2 of the first external light OL1 may be reflected on the epidermal layer EPM and the dermal layer DER and may exit to the outside of the skin SKN through the points different from the entering point of the external light OL1.

This phenomenon may be defined as an optical waveguide phenomenon by the skin SKN. In an exemplary embodiment of the inventive concepts, the driving method of the display device DD may determine the duplicate fingerprint by using the optical waveguide phenomenon by the skin SKN.

Figure 19:
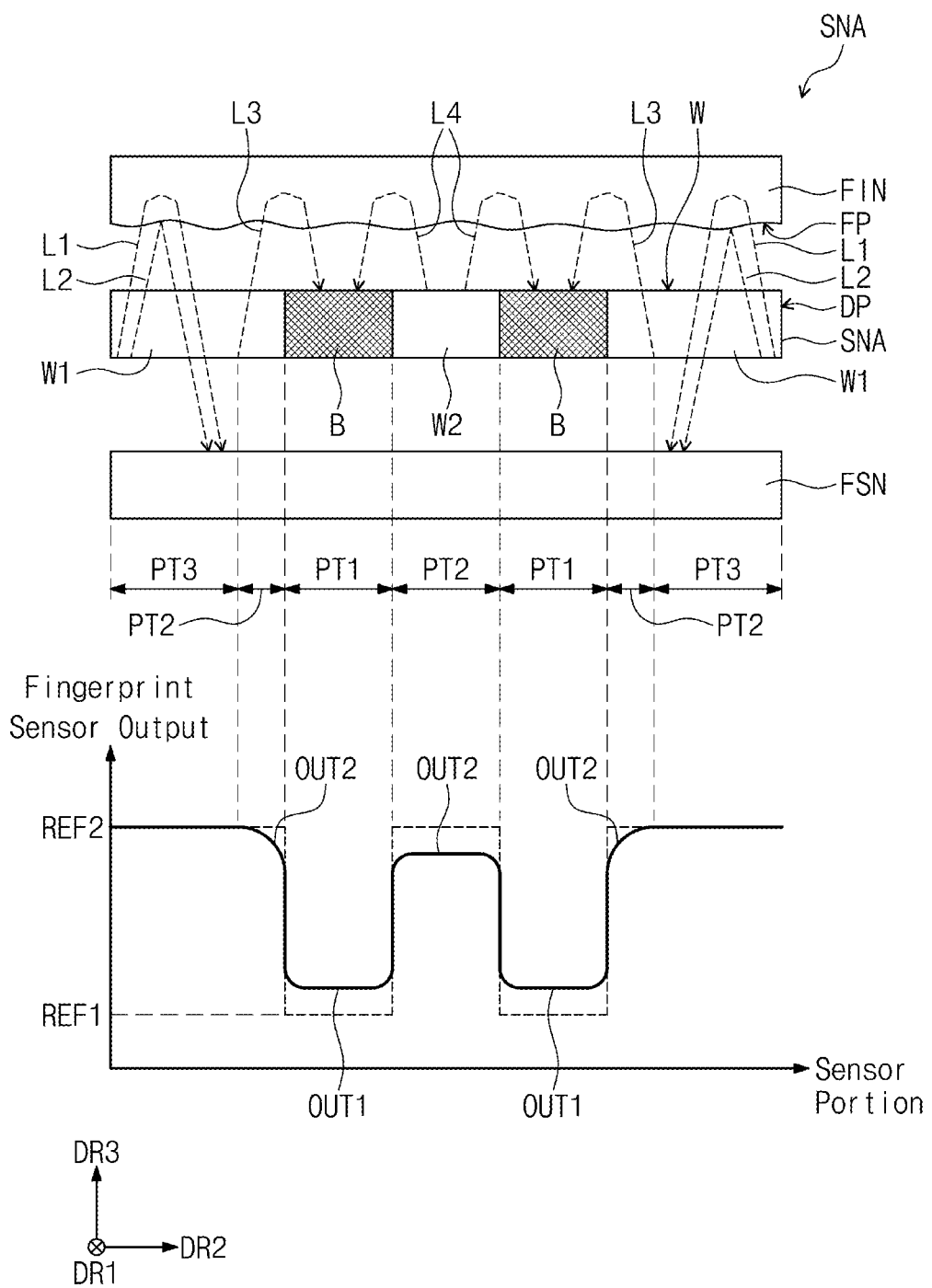
FIG. 19 is a view illustrating paths of lights generated in the sensing area of in FIG. 17 and an output from a fingerprint sensor.
Figure 20:
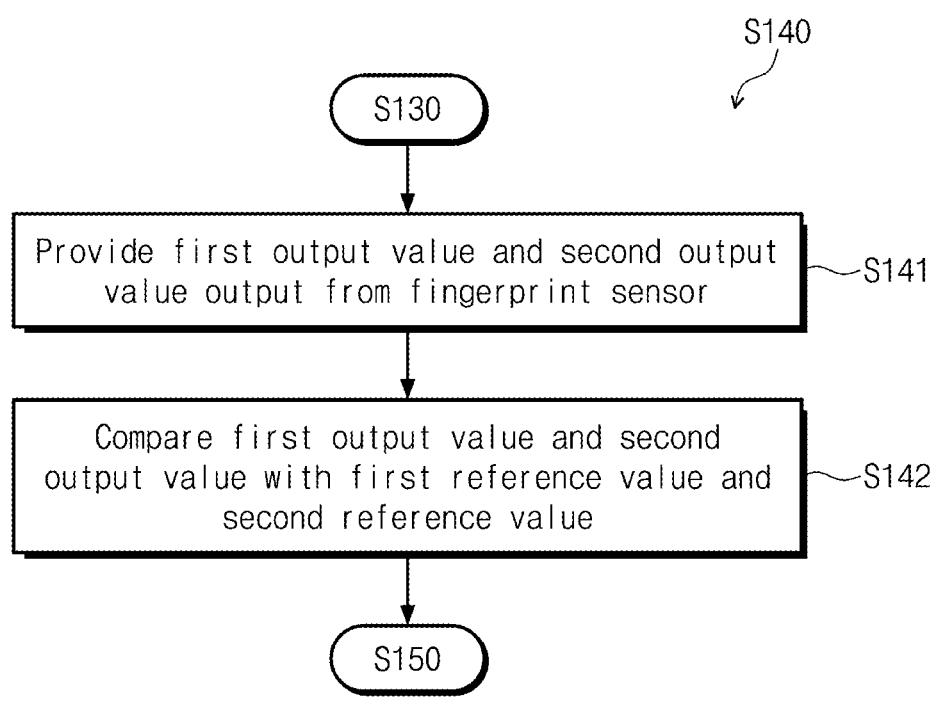
FIG. 20 is a flowchart illustrating a method of comparing a sensed fingerprint with a duplicate fingerprint.
Figure 21:
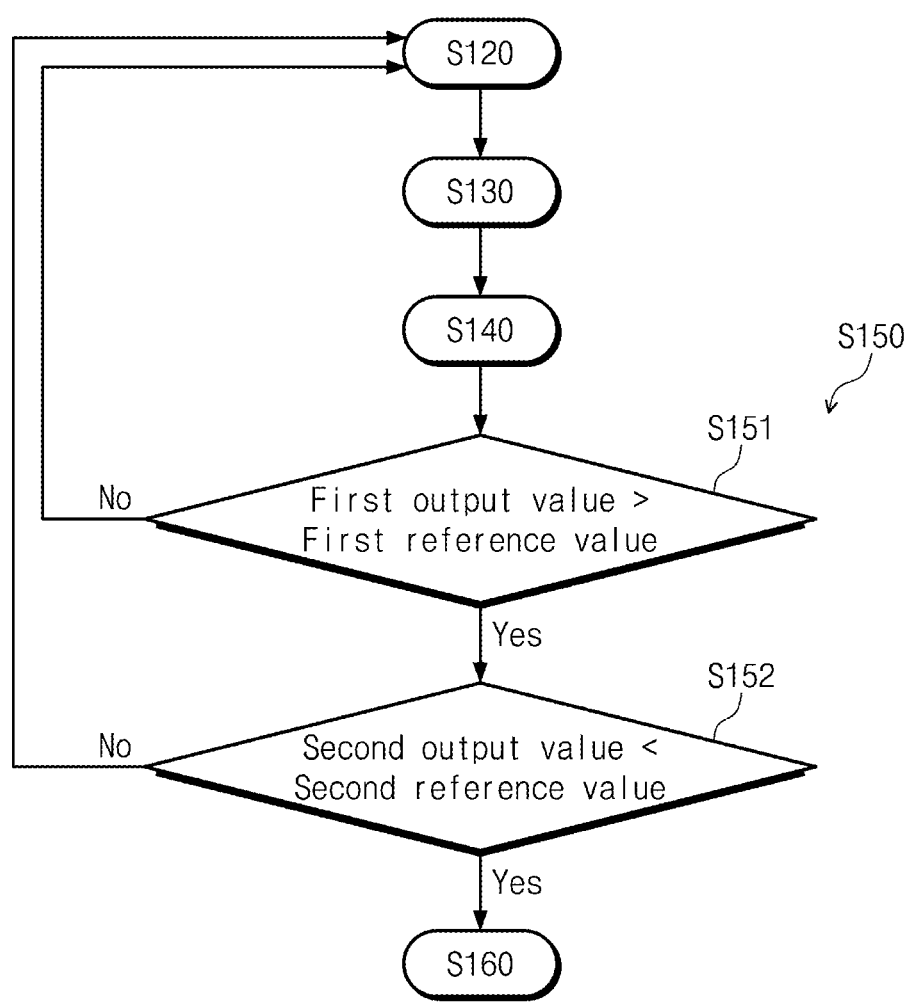
FIG. 21 is a flowchart illustrating a method of determining whether the sensed fingerprint is a normal fingerprint of FIG. 15.

FIG. 19 is a view illustrating paths of lights generated in the sensing area of FIG. 17 and an output from a fingerprint sensor. FIG. 20 is a flowchart illustrating a method of comparing the sensed fingerprint with the duplicate fingerprint. FIG. 21 is a flowchart illustrating a method of determining whether the sensed fingerprint is the normal fingerprint of FIG. 15.

FIG. 19 illustrates cross-sections of the sensing area SNA, the finger FIN, and the fingerprint sensor FSN when viewed in the first direction DR1 as a representative example.

Referring to FIG. 19, lights L1, L2, L3, and L4 generated in the color patterns of the sensing area SNA below the finger may travel to the finger FIN and may be reflected by the finger FIN. The first color pattern W may include first sub-patterns W1 and a second sub-pattern W2. The second sub-pattern W2 may be disposed between the second color patterns B. The second color patterns B may be disposed between the first sub-patterns W1 and the second sub-pattern W2. Each of the first sub-patterns W1 has a width greater than a width of the second sub-pattern W2 in the second direction DR2.

The display panel DP may generate the first light L1, the second light L2, the third light L3, and the fourth light L4. Hereinafter, the first light L1, the third light L3, and the fourth light L4 are illustrated as lights that are scattered and reflected after traveling into the skin of the finger FIN and are emitted out of the skin. In addition, the second light L2 is illustrated as a light reflected by the surface of the skin of the finger FIN. However, this is merely exemplary, and the first to fourth lights L1 to L4 may include the light reflected by the surface of the skin and the lights scattered and reflected from inside the skin.

The first light L1 generated by the first sub-patterns W1 may travel into the skin of the finger FIN, may be scattered and reflected in the skin of the finger FIN, and may travel to the first sub-patterns W1 again. The second light L2 generated by the first sub-patterns W1 may be reflected by the skin surface of the finger FIN and may travel to the first sub-patterns W1 again. Accordingly, the first light L1 and the second light L2 may be provided to the fingerprint sensor FSN after transmitting through the first sub-patterns W1.

The third light L3 generated by the first sub-patterns W1 may travel into the skin of the finger FIN, may be scattered and reflected in the skin of the finger FIN, and may be provided to the second color patterns B. The third light L3 may not be provided to the first color pattern W again. Because the third light L3 is provided to the second color patterns B, a luminance of the second color patterns B may increase even though the second color patterns B have the black color. Light is generated in the first sub-pattern W1 and the second sub-pattern W2, but embodiments are not necessarily limited thereto. Lights may be generated from the second color patterns B and may be generated from other color patterns when other color patterns are used.

The fourth light L4 generated by the second sub-pattern W2 may travel into the skin of the finger FIN, may be scattered and reflected in the skin of the finger FIN, and may be provided to the second color patterns B. The fourth light L4 may not be provided to the first color pattern W again. Because the fourth light L4 is provided to the second color patterns B, a luminance of the second color patterns B may increase even though the second color patterns B have the black color.

The first sub-patterns W1 having a relatively large size may receive the light reflected by the finger, such as the first and second lights L1 and L2, again. However, the second sub-pattern W2 having a relatively small size may not receive the light reflected by the finger, such as the fourth light L4, again. Thus, the luminance of the second sub-pattern W2 may decrease to a certain extent.

In addition, portions of the first sub-patterns W1, which are adjacent to the second color patterns B, may not receive the light reflected by the finger, such as the third light L3, again. The luminance of the portions of the first sub-patterns W1, which are adjacent to the second color patterns B may decrease to a certain extent. However, the luminance of the second sub-pattern W2 and the luminance of the portions of the first sub-patterns W1, which are adjacent to the second color patterns B, may be higher than the luminance of the second color patterns B displaying the black color. The luminance of the light may affect the output value of the fingerprint sensor FSN.

The fingerprint sensor FSN may include first portions PT1 overlapping the second color patterns B and second portions PT2 overlapping the portions W2 and portions of W1 of the first color patterns W adjacent to the second color patterns B. The second portions PT2 of the fingerprint sensor FSN may overlap the second sub-pattern W2 and the portions of the first sub-patterns W1, which are adjacent to the second color patterns B. Remaining portions of the fingerprint sensor FSN other than the first and the second portions PT1 and PT2 may be defined as third portions PT3. Though not illustrated, light from third and fourth lights L3 and L4 may reflect on second portions PT2.

A light provided to the third portions PT3 of the fingerprint sensor FSN may have the greatest luminance. A light provided to the first portions PT1 may have the smallest luminance. A light provided to the second portions PT2 may have a luminance between the luminance of the light provided to the first portions PT1 and the luminance of the light provided to the third portions PT3.

When the light is not provided to the second color patterns B, the output values from the fingerprint sensor FSN of the first portions PT1 may be a first reference value REF1. However, the lights that enter into the skin and are reflected therefrom, such as the third and fourth lights L3 and L4, may be provided to the second color patterns B, and thus, the luminance of the second color patterns B may increase. Because some lights are provided to the first portions PT1 due to the second color patterns B whose luminance increases, the output values of the first portions PT1 may have a first output value OUT1 higher than the first reference value REF1.

In a case where the third and fourth lights L3 and L4 generated in the portions of the first color pattern W overlapping the second portions PT2 are provided to the first color pattern W overlapping the second portions PT2 again without being provided to the second color patterns B, the output values of the second portions PT2 of the fingerprint sensor FSN may be a second reference value REF2.

However, the third and fourth lights L3 and L4 may be provided to the second color patterns B without being provided to the first color pattern W overlapping the second portions PT2 after entering into the skin, and thus, some lights of the first color pattern W may be lost. Accordingly, the luminance of the light provided to the second portions PT2 may decrease, and the output values of the second portions PT2 of the fingerprint sensor FSN may have a second output value OUT2 lower than the second reference value REF2.

Because the first and second lights L1 and L2 are provided to the third portions PT3, the output values of the third portions PT3 may have the second reference value REF2.

The first reference value REF1 and the second reference value REF2 may be defined as values output from the fingerprint sensor FSN when the fingerprint sensor FSN senses the duplicate (fake) fingerprint. In the duplicate fingerprint, there is no light (optical waveguide of the skin) traveling into the skin of the finger. Accordingly, there may be no light that is lost in the first color pattern W and provided to the second color patterns B, such as the third and fourth lights L3 and L4. Therefore, the output values in the fingerprint sensor FSN obtained by sensing the duplicate fingerprint may have the first reference value REF1 and the second reference value REF2.

The first reference value REF1 may be defined as a sensing value of the duplicate fingerprint corresponding to the first portions PT1. The second reference value REF2 may be defined as a sensing value of the duplicate fingerprint corresponding to the second portions PT2.

Referring to FIGS. 19 and 20, the first output value OUT1 and the second output value OUT2 output from the fingerprint sensor FSN may be provided (S141). For example, the output value OUT1 output from each of the first portions PT1 and the output value OUT2 output from each of the second portions PT2 may be provided. The first and second output values OUT1 and OUT2 may be provided to the main controller MC of the control module CM.

The first reference value REF1 and the second reference value REF2 may be stored in the main controller MC. The first output value OUT1 and the second output value OUT2 may be compared with the first reference value REF1 and the second reference value REF2 by the main controller MC (S142).

Referring to FIGS. 19 and 21, the sensed fingerprint may be determined as the normal fingerprint or the duplicate fingerprint according to the compared result of the output value of the sensed fingerprint with the reference value corresponding to the duplicate fingerprint (S150). For example, when the first output value OUT1 is greater than the first reference value REF1 (S151), the driving method proceeds to operation S152. When the second output value OUT2 is smaller than the second reference value REF2 (S152), the sensed fingerprint may be determined as the normal fingerprint, and the driving method proceeds to operation S160 to perform the user authentication mode.

When the first output value OUT1 is not greater than the first reference value REF1 (S151), the sensed fingerprint may be determined as the duplicate fingerprint, and the driving method proceeds to operation S120 to require the re-entry of the fingerprint.

In the present exemplary embodiment, the comparison operation of the first output value OUT1 with the first reference value REF1 and the comparison operation of the second output value OUT2 with the second reference value REF2 are performed together, however, an exemplary embodiment of the inventive concepts should not be limited thereto or thereby.

The comparison operation of the second output value OUT2 with the second reference value REF2 may not be performed, and whether the sensed fingerprint is the duplicate fingerprint may be determined by only comparing the first output value OUT1 with the first reference value REF1. For example, when the first output value OUT1 is greater than the first reference value REF1, the sensed fingerprint may be determined as the normal fingerprint, and the user authentication mode may be performed. When the first output value OUT1 is not greater than the first reference value REF1, the sensed fingerprint may be determined as the duplicate fingerprint, and the re-entry of the fingerprint may be required.

As another way, the comparison operation of the first output value OUT1 with the first reference value REF1 may not be performed, and whether the sensed fingerprint is the duplicate fingerprint may be determined by only comparing the second output value OUT2 with the second reference value REF2. For example, when the second output value OUT2 is smaller than the second reference value REF2, the sensed fingerprint may be determined as the normal fingerprint, and the user authentication mode may be performed. When the second output value OUT2 is not smaller than the second reference value REF2, the sensed fingerprint may be determined as the duplicate fingerprint, and the re-entry of the fingerprint may be required.

According to an exemplary embodiment of the inventive concepts, when the fingerprint is input to the display device DD, whether the sensed fingerprint is the duplicate fingerprint may be first determined, and the user authentication mode may be performed. Accordingly, the authentication security of the display device DD may be enhanced.

FIGS. 22A to 22F are views illustrating a first color pattern and a second color pattern according to various exemplary embodiments of the inventive concepts.

Figure 22A:
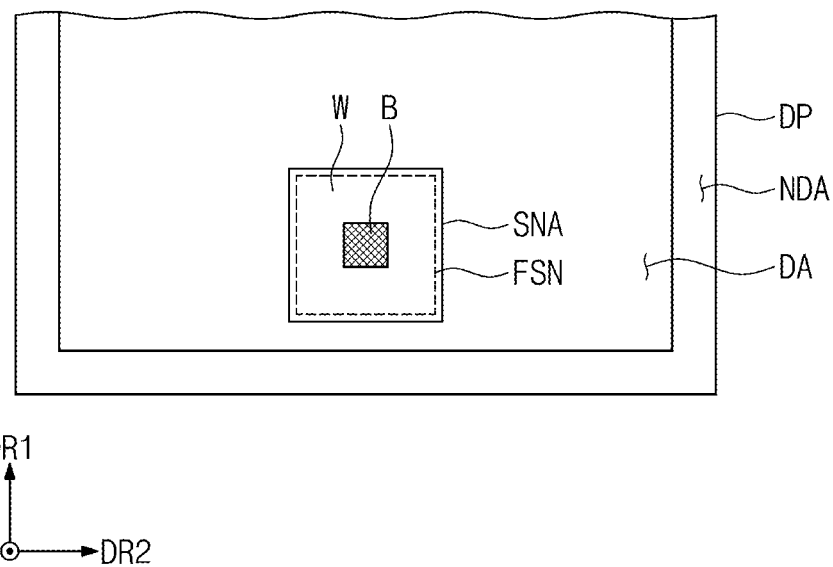
FIGS. 22A, 22B, 22C, 22D, 22E, and 22F are views illustrating a first color pattern and a second color pattern according to various exemplary embodiments of the inventive concepts.

Referring to FIG. 22A, the first color pattern W may be disposed to surround the second color pattern B.

Figure 22B:
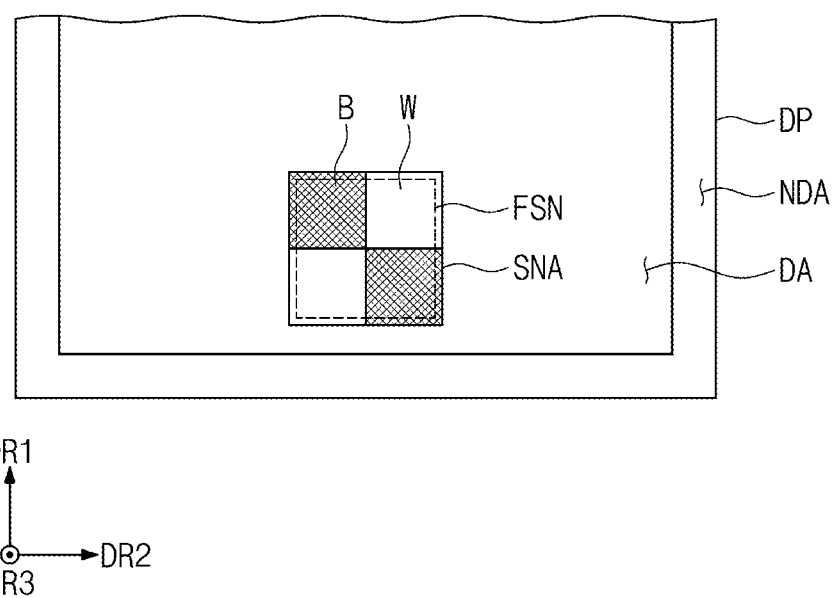

Referring to FIG. 22B, the first color pattern W and the second color pattern B may be alternately arranged with each other in the first direction DR1 and the second direction DR2. For example, the sensing area SNA may be driven to display a checkered pattern. As a representative example, two first and second color patterns W and B are arranged in the first and second directions DR1 and DR2, however, the number of the first and second patterns W and B may be greater than two.

Figure 22C:
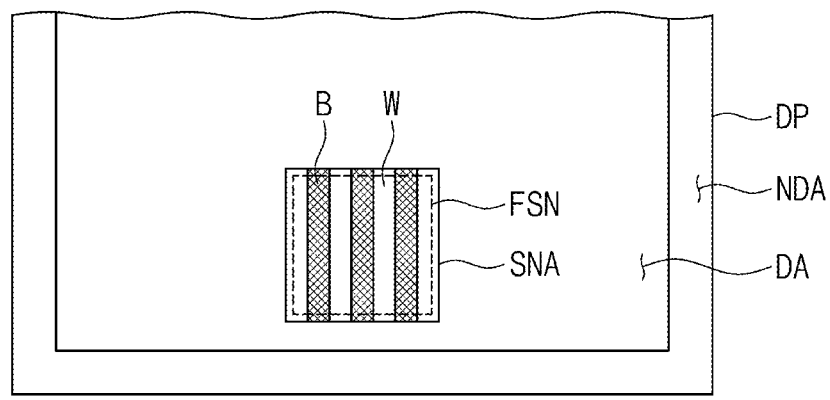
Figure 22C:
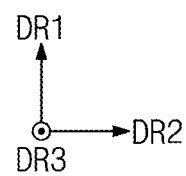
Figure 22D:
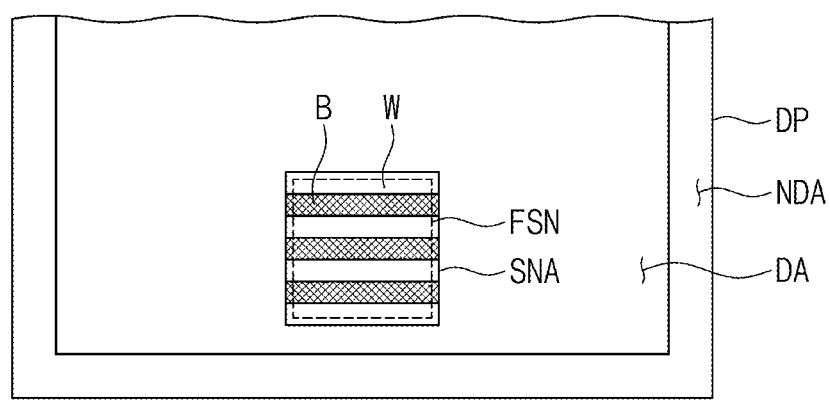
Figure 22D:
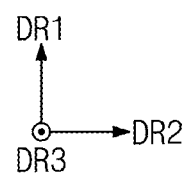

Referring to FIGS. 22C and 22D, the first color pattern W and the second color pattern B may extend in one direction. For example, the first color pattern W and the second color pattern B may have a stripe shape.

Referring to FIG. 22C, the first color pattern W may include a plurality of white areas W extending in the first direction DR1 and arranged in the second direction DR2. The second color pattern B may include a plurality of black areas B extending in the first direction DR1, arranged in the second direction DR2, and disposed between the white areas W.

Referring to FIG. 22D, the first color pattern W may include a plurality of white areas W extending in the second direction DR2 and arranged in the first direction DR1. The second color pattern B may include a plurality of black areas B extending in the second direction DR2, arranged in the first direction DR1, and disposed between the white areas W.

Figure 22E:
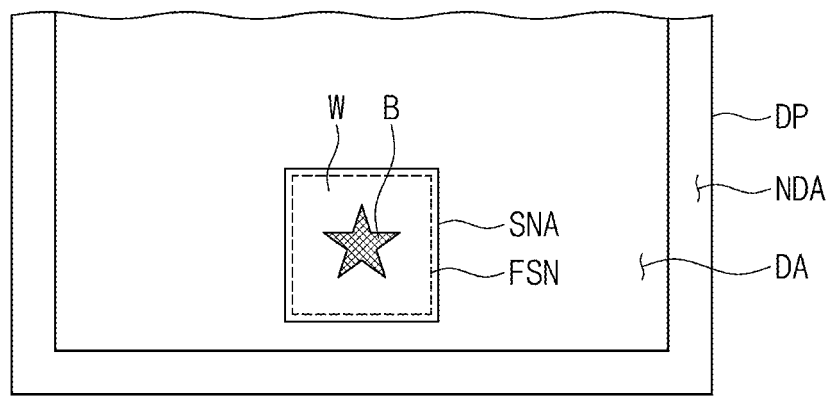
Figure 22E:
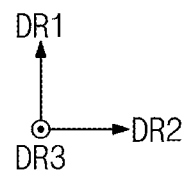

Referring to FIG. 22E, the second color pattern B may have a shape of a plane figure. For example, the second color pattern B may have a star shape.

Figure 22F:
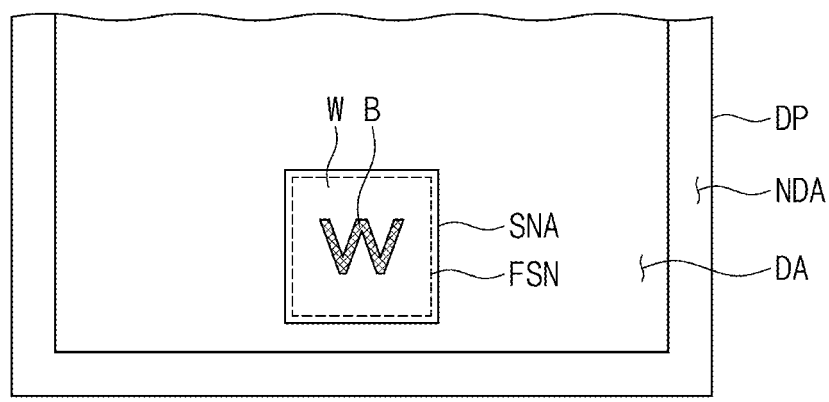
Figure 22F:
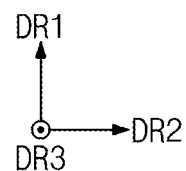

Referring to FIG. 22F, the second color pattern B may have a shape of an alphabet letter. For example, the second color pattern B may have an alphabet "W" shape.

FIGS. 22A to 22F illustrate various shapes of the first color pattern W and the second color pattern B, however, the shapes of the first color pattern W and the second color pattern B should not be limited thereto or thereby.

Figure 23:
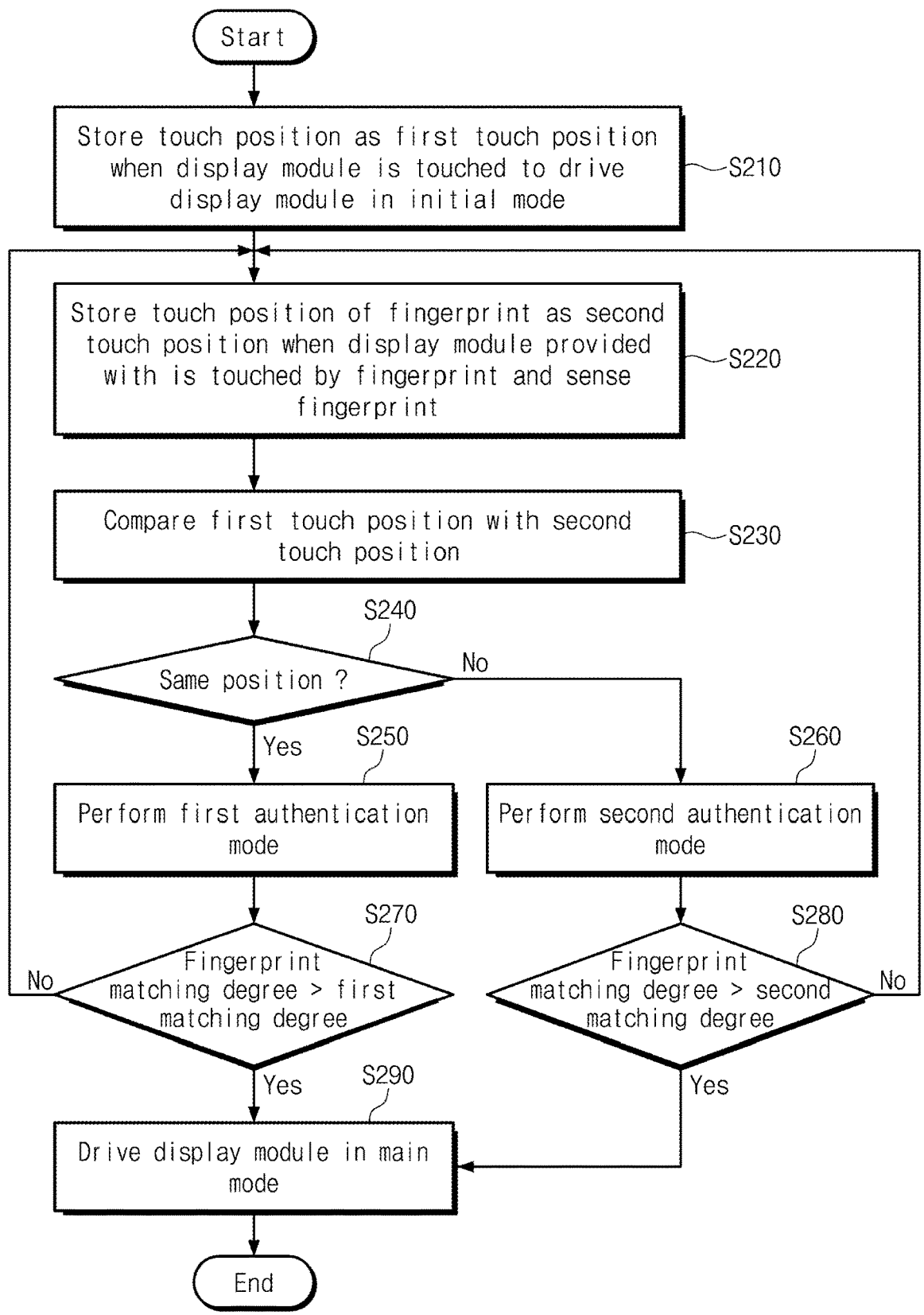
FIG. 23 is a flowchart illustrating a method of driving a display device according to an exemplary embodiment of the inventive concepts.
Figure 24:
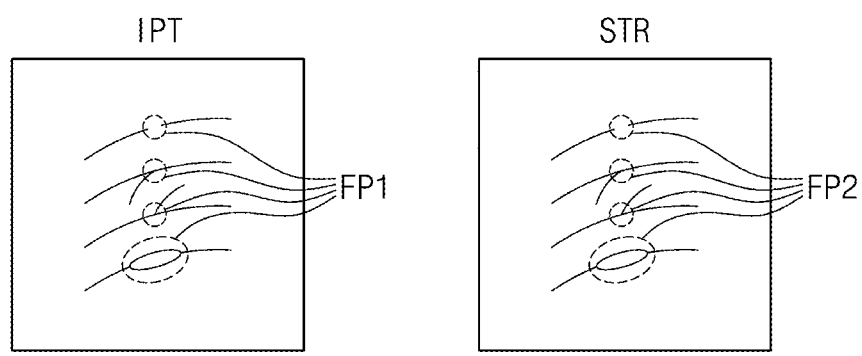
FIG. 24 is a view illustrating a method of matching a sensed fingerprint with a user's fingerprint.

FIG. 23 is a flowchart illustrating a method of driving a display device according to an exemplary embodiment of the inventive concepts. FIG. 24 is a view illustrating a method of matching the sensed fingerprint with the stored user's fingerprint.

The display module DM may establish a first touch position and a second touch position through which a user may self-authenticate and begin operation of the display module DM in a main mode. The first touch position and second touch position may be initially set by a device manufacturer or distributor, and may be re-set by a user at a later time. There may be a plurality of fingerprint sensor FSN areas available to be set as the first touch position and the second touch position. Also, a single touch position may be established as the first touch position and the second touch position.

Referring to FIG. 23, the display module DM may be touched in a portion of the display module DM in which the fingerprint sensor FSN is disposed to drive the display module DM in the initial mode (S210). When the display module DM is touched to drive the display module DM in the initial mode in operation S210, the touch position of the display module DM may be stored in the main controller MC as the first touch position. The first touch may be used to establish the first touch position and the first touch may also be used to turn on a device. After the first touch position is set, the fingerprint touches a portion of the display module DM in which a fingerprint sensor FSN is disposed, another touch position of the fingerprint may be stored in the main controller MC as the second touch position, and the fingerprint may be sensed. The touch positions of the fingerprint may be substantially one ore more sensing areas SNA of the display module DM in which the fingerprint sensor FSN is disposed. The touch position of the display module DM and the touch position of the fingerprint may be sensed by the input sensing part ISP.

The main controller MC may compare the first touch position with the second touch position (S230). When the first touch position and the second touch position are the same position as each other (S240), the driving method proceeds to operation S250, and the first user authentication mode may be performed. When the first touch position and the second touch position are different positions from each other (S240), the driving method proceeds to operation S260, and the second user authentication mode may be performed.

In some instances, the owner of the display device DD may want to perform the turn-on operation of the display device DD and the user authentication operation together. Accordingly, the owner may perform a touch operation to turn on the display device DD and the touch operation for the fingerprint authentication together. For example, the owner may touch the finger on the sensing area and then may maintain the touched state for a predetermined or pre-set period of time. When the finger touches the sensing area, the display device DD is turned on, and when the touched state of the sensing area is maintained as it is for the predetermined or preset amount of time, the fingerprint may be sensed and the fingerprint authentication operation may be performed continuously as a next operation.

This operation is practicable because the owner may know the location of the fingerprint sensor FSN sensing area SNA through the repeated use of the display device DD. Accordingly, when the user is a normal user such as a user that uses the device repeatedly, the first touch position and the second touch position may be the same position.

However, because another user who is not the owner of the display device DD does not know the location of the fingerprint sensor FSN, various different locations of the display device DD may be touched to turn on the display device DD. The another user may input a fingerprint when a fingerprint input position is displayed after the display device DD is turned on. That is, when the another user is not the owner, the first touch position and the second touch position may be different from each other.

The first user authentication mode may be the user authentication mode described in operation S160. The second user authentication mode may require an enhanced or additional security than the first user authentication mode.

Referring to FIG. 24, the sensed fingerprint IPT may be compared with the stored user's fingerprint STR. For example, first feature points FP1 of the sensed fingerprint IPT and second feature points FP2 of the user's fingerprint STR may be selected. The first and second feature points FP1 and FP2 may be selected at portions where fingerprint lines are broken, portions where fingerprint lines intersect, and portions which form a closed curve in the fingerprint line.

The first feature points FP1 and the second feature points FP2 may be compared with each other to compare the sensed fingerprint IPT with the user's fingerprint STR. User authentication may be performed according to a matching degree of the first feature points FP1 and the second feature points FP2. The matching degree of the first feature points FP1 and the second feature points FP2 may be defined as a fingerprint matching degree.

Referring to FIG. 23, when the first touch position and the second touch position are the same position, the user who touches the display device DD may be determined as the owner of the display device DD, and thus, the first user authentication mode may be performed. When the first touch position and the second touch position are different from each other, the user who touches the display device DD may not be determined as the owner of the display device DD, and thus, the second user authentication mode, which has an enhanced security, may be performed.

When the first user authentication mode is performed, the first feature points FP1 may be compared with the second feature points FP2. In operation S270, it may be determined whether the fingerprint matching degree is greater than a first matching degree. As an example, the first matching degree may be set to about 70%. In this case, when it is determined that the matching degree between the first feature points FP1 and the second feature points FP2 is greater than about 70% in operation S270, the sensed fingerprint may be authenticated as the user, the driving method proceeds to S290, and the display module DM may be driven in the main mode.

When it is determined that the matching degree between the first feature points FP1 and the second feature points FP2 is equal to or smaller than about 70% in operation S270, the sensed fingerprint may not be authenticated as the user, the driving method proceeds to S220, and the re-entry of the fingerprint may be required.

When the second user authentication mode is performed, the first feature points FP1 may be compared with the second feature points FP2. In operation S280, it may be determined whether the fingerprint matching degree is greater than a second matching degree. The second matching degree may have a value greater than the first matching degree. As an example, the second matching degree may be set to about 90%. In this case, when it is determined that the matching degree between the first feature points FP1 and the second feature points FP2 is greater than about 90% in operation S280, the sensed fingerprint may be authenticated as the user, the driving method proceeds to S290, and the display module DM may be driven in the main mode.

When it is determined that the matching degree between the first feature points FP1 and the second feature points FP2 is equal to or smaller than about 90% in operation S280, the sensed fingerprint may not be authenticated as the user, the driving method proceeds to S220, and the re-entry of the fingerprint may be required.

According to an exemplary embodiment of the inventive concepts, as the first user authentication mode or the second user authentication mode is performed according to the compared result of the first touch position and the second touch position, the authentication security of the display device DD may be enhanced.

Figure 25:
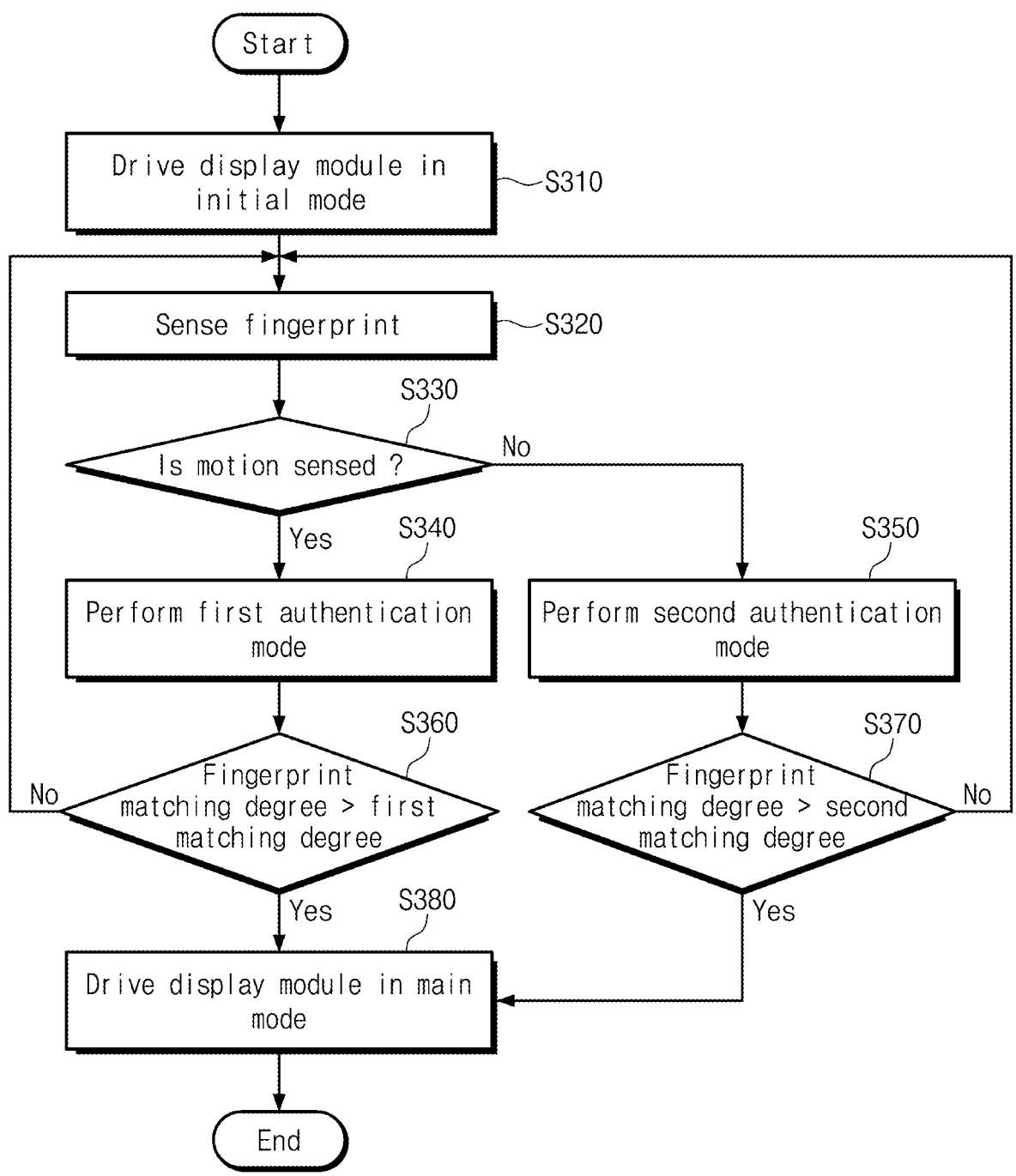
FIG. 25 is a flowchart illustrating a method of driving a display device according to an exemplary embodiment of the inventive concepts.

FIG. 25 is a flowchart illustrating a method of driving a display device according to an exemplary embodiment of the inventive concepts.

Referring to FIG. 25, the display module DM may be driven in the initial mode in operation S310. The fingerprint may be sensed in operation S320. When the fingerprint is sensed, a motion of the display module DM may be sensed in operation S330.

In general, the user may operate the display device DD, for example, a mobile phone, while holding the display device in his or her hand. When the user's fingerprint is input, the display module DM may be shaken, and the motion of the display module DM may be sensed in combination with fingerprint input. For this operation, the display module DM may include a motion sensor.

To determine movement in combination with fingerprint input, a predetermined or pre-set time period may be set to establish a threshold for the combination. For example if a device is moved and a fingerprint is input in a time period under or equal to a threshold, adequate movement may be determined to match an authorized user and trigger the first authentication mode.

However, when the duplicate fingerprint is input, the display device DD may be placed on a top of work surface to input the duplicate (fake) fingerprint copied on a tape or using some other fabrication method, and the tape on which the fingerprint is copied may be brought into contact with the display module DM. In this case, the motion of the display module DM may not be sensed in combination with fingerprint input.

If the movement of the display device DD and the fingerprint input occur in a time period over the threshold, an inadequate movement may be determined and a possible unauthorized user may trigger a second authentication mode. The display device DD may be set up to take either the device movement or the fingerprint sensing as an initial input, and either the fingerprint sensing or the device movement as the second input, when considering threshold times.

When the motion is sensed in operation S330, the driving method may proceed to operation 340, and the first user authentication mode may be performed. However, when the motion is not sensed in operation S330, the driving method may proceed to operation S350, and the second user authentication mode may be performed. Operations in S340 to S380 are substantially the same as those in S250 to S290, and thus, descriptions thereof are omitted.

According to an exemplary embodiment of the inventive concepts, the first user authentication mode or the second user authentication mode is performed according to whether the motion of the display module DM is sensed when the fingerprint is sensed, and thus, the authentication security of the display device DD may be enhanced.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed. Therefore, the disclosed subject matter should not be limited to any single embodiment described herein, and the scope of the present inventive concepts shall be determined according to the attached claims.

What is claimed is:

1. A method of driving a display device, comprising:
   driving a display panel comprising a sensing area defined above a fingerprint sensor in an initial mode;
   driving the sensing area in a first color pattern having a first color and a second color pattern having a second color different from the first color of the first color pattern;
   sensing a fingerprint through the fingerprint sensor that receives a light reflected by the fingerprint when the fingerprint is adjacent to the sensing area;
   determining whether the sensed fingerprint is a duplicate fingerprint; and
   performing a user authentication mode when the sensed fingerprint is a normal fingerprint,
   wherein the first color pattern has a light transmittance higher than a light transmittance of the second color pattern,
   wherein the determining of the duplicate fingerprint comprises:
   comparing an output value of the sensed fingerprint sensed by the fingerprint sensor with a reference value defined by a value output from the fingerprint sensor when the duplicate fingerprint is sensed; and
   determining the sensed fingerprint as the normal fingerprint or the duplicate fingerprint according to the compared result of the output value and the reference value, wherein the output value comprises:
   a first output value output from a first portion of the fingerprint sensor overlapping the second color pattern; and
   a second output value output from a second portion of the fingerprint sensor overlapping the first color pattern adjacent to the second color pattern, and
   wherein the reference value comprises:
   a first reference value defined by a sensed value of the duplicate fingerprint corresponding to the first portion; and
   a second reference value defined by a sensed value of the duplicate fingerprint corresponding to the second portion.

2. The method of claim 1, wherein the first color pattern has a white color, and the second color pattern has a black color.

3. The method of claim 2, wherein the second color pattern comprises:
   a plurality of black areas extending in a first direction and arranged in a second direction crossing the first direction, and the first color pattern is disposed around each of the black areas.

4. The method of claim 1, wherein the first color pattern has a color other than a white color, and the second color pattern has a black color.

5. The method of claim 1, wherein the determining of the sensed fingerprint as the normal fingerprint or the duplicate fingerprint comprises determining the sensed fingerprint as the normal fingerprint when the first output value is greater than the first reference value and the second output value is smaller than the second reference value.

6. The method of claim 5, wherein the determining of the sensed fingerprint as the normal fingerprint or the duplicate fingerprint comprises:
   determining the sensed fingerprint as the duplicate fingerprint when the first output value is equal to or smaller than the first reference value or the second output value is equal to or greater than the second reference value.

7. The method of claim 1, wherein the determining of the sensed fingerprint as the normal fingerprint or the duplicate fingerprint comprises:
   determining the sensed fingerprint as the normal fingerprint when the first output value is greater than the first reference value.

8. The method of claim 1, wherein the determining of the sensed fingerprint as the normal fingerprint or the duplicate fingerprint comprises:
   determining the sensed fingerprint as the normal fingerprint when the second output value is smaller than the second reference value.

9. The method of claim 1, wherein the performing of the user authentication mode comprises:
   comparing the sensed fingerprint with a stored user's fingerprint; and
   driving the display panel in a main mode when the sensed fingerprint matches the user's fingerprint.

10. The method of claim 1, wherein the first color pattern and the second color pattern are alternately arranged with each other in the first direction and in a second direction crossing the first direction.

11. The method of claim 1, wherein the first color pattern is disposed to surround the second color pattern.

12. The method of claim 1, wherein the first color pattern comprises:
    a plurality of white areas extending in a first direction and arranged in a second direction crossing the first direction, and the second color pattern comprises a plurality of black areas extending in the first direction, arranged in the second direction, and disposed between the white areas.

13. The method of claim 1, wherein the second color pattern has a shape of an alphabet letter.

14. The method of claim 1, wherein the second color pattern has a shape of a plane figure.

15. A display device comprising:
a display panel including a sensing area, the display panel being driven in an initial mode and a main mode;
a fingerprint sensor disposed under the sensing area and configured to sense a fingerprint adjacent to the sensing area when the display panel is driven in the initial mode; and
a control module controlling an operation of the display panel and the fingerprint sensor,
wherein the fingerprint sensor is configured to receive a light provided to the fingerprint reflected by the fingerprint in the sensing area and sense the fingerprint, the control module is configured to drive the sensing area in a first color pattern having a first color and a second color pattern having a second color different from the first color of the first color pattern when the display panel is driven in the initial mode, and the first color pattern having a light transmittance higher than a light transmittance of the second color pattern,
wherein the control module compares an output value of the sensed fingerprint sensed by the fingerprint sensor with a reference value defined by a value output from the fingerprint sensor when the duplicate fingerprint is sensed, and determines the sensed fingerprint as the normal fingerprint or the duplicate fingerprint according to the compared result of the output value and the reference value,
wherein the output value comprises:
a first output value output from a first portion of the fingerprint sensor overlapping the second color pattern; and
a second output value from a second portion of the fingerprint sensor overlapping the first color pattern adjacent to the second color pattern, and
wherein the reference value comprises:
a first reference value defined by a sensed value of the duplicate fingerprint corresponding to the first portion; and
a second reference value defined by a sensed value of the duplicate fingerprint corresponding to the second portion.

16. A method of driving a display device, comprising:
storing a touch position of a display module as a first touch position when the display module is touched to be driven in an initial mode;
storing a touch position of a fingerprint as a second touch position when the fingerprint touches a portion of the display module where a fingerprint sensor is disposed and sensing the fingerprint;
performing a first user authentication mode when the first touch position and the second touch position are the same as each other; and
performing a second user authentication mode having an enhanced security mode compared with the first user authentication mode when the first touch position and the second touch position are different from each other; and
sensing a motion of the display module when the fingerprint is sensed;
performing the first user authentication mode when the motion of the display module is sensed; and
performing the second user authentication mode when the motion of the display module is not sensed.

17. The method of claim 16, wherein performing of the first user authentication mode comprises:
driving the display module in a main mode when a matching degree between the sensed fingerprint and a stored user's fingerprint is greater than a first matching degree,
wherein the performing of the second user authentication mode comprises driving the display module in the main mode when the matching degree between the sensed fingerprint and the stored user's fingerprint is greater than a second matching degree, and
wherein the second matching degree is greater than the first matching degree.

* * * * *